(12) United States Patent
Kobayashi

(10) Patent No.: US 8,271,862 B2
(45) Date of Patent: Sep. 18, 2012

(54) ERROR CORRECTION DECODING DEVICE AND REPRODUCTION DEVICE

(75) Inventor: Hideki Kobayashi, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 379 days.

(21) Appl. No.: 12/669,699

(22) PCT Filed: Jul. 19, 2007

(86) PCT No.: PCT/JP2007/064255
§ 371 (c)(1),
(2), (4) Date: Mar. 5, 2010

(87) PCT Pub. No.: WO2009/011059
PCT Pub. Date: Jan. 22, 2009

(65) Prior Publication Data
US 2010/0211857 A1    Aug. 19, 2010

(51) Int. Cl.
*G06F 11/00* (2006.01)
(52) U.S. Cl. .................. 714/794; 714/786
(58) Field of Classification Search .......... 714/794, 714/784, 752, 755, 759, 764; 375/341
See application file for complete search history.

(56) References Cited

U.S. PATENT DOCUMENTS

| | | | |
|---|---|---|---|
| 6,205,568 B1 | 3/2001 | Kodama | |
| 6,493,846 B1* | 12/2002 | Kondo et al. | 714/794 |
| 7,529,323 B2* | 5/2009 | Lui et al. | 375/341 |
| 7,904,780 B2* | 3/2011 | Brandman | 714/752 |
| 2003/0037300 A1* | 2/2003 | Kondo et al. | 714/794 |
| 2003/0043487 A1 | 3/2003 | Morita et al. | |
| 2004/0187066 A1 | 9/2004 | Ichihara et al. | |
| 2005/0120286 A1 | 6/2005 | Akamatsu | |
| 2006/0274862 A1* | 12/2006 | Lui et al. | 375/341 |

FOREIGN PATENT DOCUMENTS

| | | |
|---|---|---|
| JP | 10-229344 A | 8/1998 |
| JP | 2003-068024 A | 3/2003 |
| JP | 2004-127408 A | 4/2004 |
| JP | 2004-253017 A | 9/2004 |
| JP | 2005-166089 A | 6/2005 |
| JP | 2006-279396 A | 10/2006 |
| JP | 2006-340016 A | 12/2006 |

* cited by examiner

*Primary Examiner* — Dieu-Minh Le
(74) *Attorney, Agent, or Firm* — Sughrue Mion, PLLC

(57) ABSTRACT

A decoding device which performs error correction decoding of encoded data formed from a combination of an outer code for first error correction and an inner code for second error correction is disclosed. The decoding device has: a demodulator for creating a data series of likelihood information values; a second error correction decoder for creating a hard decision value series by executing repetitive decoding for the second error correction based on the likelihood information values; and a first error correction decoder for detecting a lost bit in the hard decision value series and creating an erasure flag indicating the position of the detected lost bit. The second error correction decoder, according to the erasure flag, executes the repetitive decoding based on a likelihood information value not corresponding to the position of the lost bit among the data series of the likelihood information values and a predetermined value that invalidates the likelihood information value corresponding to the position of the lost bit.

11 Claims, 24 Drawing Sheets

ERROR CORRECTION DECODING DEVICE AND REPRODUCTION DEVICE

CROSS REFERENCE TO RELATED APPLICATION

This application is a National Stage of International Application No. PCT/JP2007/064255 filed Jul. 19, 2007, the content of which is incorporated herein by reference in its entirety.

TECHNICAL FIELD

The present invention relates to decoding technology of error correction codes, and in particular relates to decoding technology of concatenated codes and iterated codes formed from the combination of an outer code and an inner code.

BACKGROUND ART

Error correction technology is essential technology for realizing highly reliable communication systems and information recording systems. Concatenated codes and iterated codes are codes that are formed from a combination of two types of codes (outer code and inner code). For instance, an RS code (Reed-Solomon code) or a BCH code (Bose-Chaudhuri-Hocquenghem code) is broadly used as the outer code, and a convolutional code, a turbo code or an LDPC code (Low Density Parity Check code) is broadly used as the inner code. In particular, the turbo code and the LDPC code are attracting attention as an error correction code for realizing performance that approaches the Shannon limit. The LDPC code and its decoding method are disclosed, for example, in Patent Document 1 (Japanese Patent Kokai 2006-279396).

Additionally, research on decoding algorithms having high error detection performance regarding the foregoing error correction codes is being conducted. Signals read from a recording medium such as an optical disk or an HD (hard disk) is not only susceptible to random errors, they are also susceptible to burst errors resulting from the damage of the recording medium or mechanical operation of the reproduction device. Decoding algorithms for detecting burst errors with high precision are disclosed, for example, in Patent Document 2 (Japanese Patent Kokai No. 2004-127408) and Patent Document 3 (Kokai No. 2005-166089). Nevertheless, since much time is required for the decoding processing if the error detection rate of the decoding algorithm becomes higher, there is a problem in that this may cause deterioration in the throughput.

Patent Document 1: Japanese Patent Kokai No. 2006-279396
Patent Document 2: Japanese Patent Kokai No. 2004-127408
Patent Document 3: Japanese Patent Kokai No. 2005-166089

DISCLOSURE OF THE INVENTION

A first objective of the present invention in light of the above is to provide an error correction decoding device and a reproduction device capable of realizing extremely high error correction performance. The second object of the present invention is to provide an error correction decoding device and a reproduction device capable of improving the throughput while realizing high error correction performance.

The error correction decoding device according to a first aspect is a decoding device for performing error correction decoding of encoded data formed from a combination of an outer code for first error correction and an inner code for second error correction. This decoding device has: a demodulator for demodulating the encoded data and creating a data series of likelihood information values; a memory circuit for temporarily storing the data series of likelihood information values; a second error correction decoder for creating a hard decision value series by executing repetitive decoding for the second error correction based on the data series of likelihood information values read from the memory circuit; and a first error correction decoder for detecting a lost bit in the hard decision value series by executing algebraic decoding for the first error correction to the hard decision value series and creating an erasure flag indicating a position of the detected lost bit. With this decoding device, the second error correction decoder, according to the erasure flag, re-reads the data series of likelihood information values from the memory circuit, and executes the repetitive decoding based on a likelihood information value not corresponding to the position of the lost bit among the re-read data series and a predetermined value that invalidates a likelihood information value corresponding to the position of the lost bit among the re-read data series.

The error correction decoding device according to a second aspect of the present invention is a decoding device for performing error correction decoding of encoded data formed from a combination of an outer code for first error correction and an inner code for second error correction. This decoding device has: a demodulator for demodulating the encoded data and creating a data series of likelihood information values; a lost position detection part for detecting a lost bit in the data series of likelihood information values and creating a first erasure flag indicating a position of the detected lost bit; a memory circuit for temporarily storing the data series of likelihood information values; a second error correction decoder for creating a hard decision value series by executing repetitive decoding for the second error correction based on the data series likelihood information values read from the memory circuit when the lost bit is not detected, and a first error correction decoder for executing algebraic decoding for the first error correction to the hard decision value series. With this decoding device, when the lost bit is detected, the second error correction decoder executes the repetitive decoding based on a likelihood information value not corresponding to the position of the lost bit among the data series of likelihood information values read from the memory circuit and a predetermined value that invalidates a likelihood information value corresponding to the position of the lost bit among the read data series of likelihood information values.

The reproduction device according to a third aspect of the present invention is a reproduction device for reading encoded data formed from a combination of an outer code for first error correction and an inner code for second error correction from a recording medium, and performing error correction decoding of the read encoded data. This reproduction device has: a driver part for driving the recording medium and reading the encoded data from the recording medium; a demodulator for demodulating the read encoded data and creating a data series of likelihood information values, a memory circuit for temporarily storing the data series of likelihood information values; a second error correction decoder for creating a hard decision value series by executing repetitive decoding for the second error correction based on the data series likelihood information values read from the memory circuit; and a first error correction decoder for detecting a lost bit in the hard decision value series by executing algebraic decoding for the first error correction to the hard decision value series and creating a erasure flag indicating a position of the detected lost bit. With this reproduction device, the second error correction decoder, according to the erasure flag, re-reads the data series of likelihood information values from the memory circuit, and executes the repetitive decoding based on a likelihood information value not corresponding to the position of the lost bit among the re-read data series and a predetermined value that invalidates a likelihood information value corresponding to the position of the lost bit among the re-read data series.

The reproduction device according to the fourth aspect of the present invention is a reproduction device for reading encoded data formed from a combination of an outer code for first error correction and an inner code for second error correction from a recording medium, and performing error correction decoding of the read encoded data. This reproduction device has: a driver part for driving the recording medium and reading the encoded data from the recording medium; a demodulator for demodulating the encoded data and creating a data series of likelihood information values, a lost position detection part for detecting a lost bit in the data series of likelihood information values and creating a first erasure flag indicating a position of the detected lost bit; a memory circuit for temporarily storing the data series of likelihood information values; a second error correction decoder for creating a hard decision value series by executing repetitive decoding for the second error correction based on the data series likelihood information values read from the memory circuit when the lost bit is not detected, and a first error correction decoder for executing algebraic decoding for the first error correction to the hard decision value series. With this reproduction device, when the lost bit is detected, the second error correction decoder executes the repetitive decoding based on a likelihood information value not corresponding to the position of the lost bit among the data series of likelihood information values read from the memory circuit and a predetermined value that invalidates a likelihood information value corresponding to the position of the lost bit among the read data series of likelihood information values.

Figure 1:
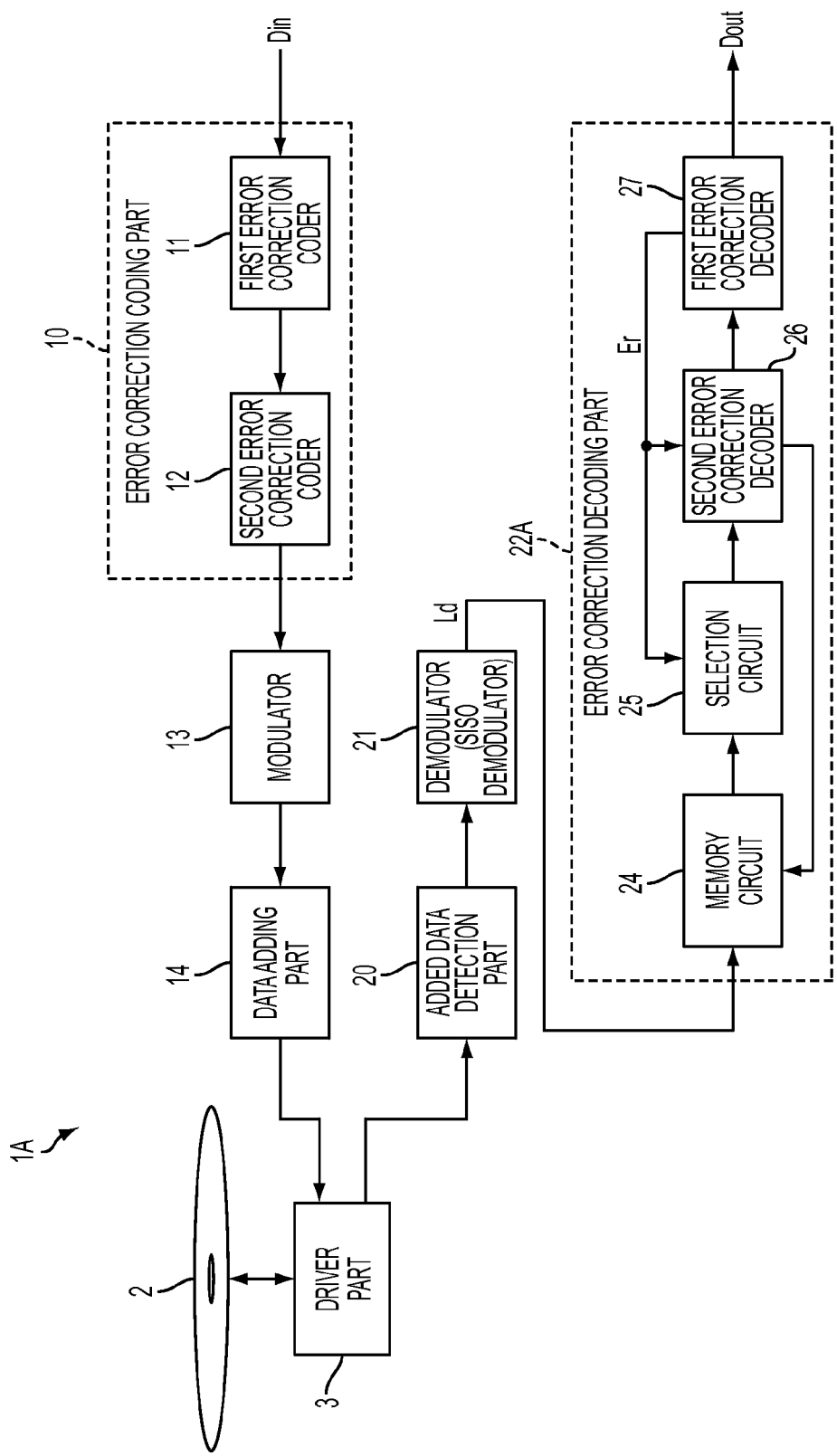
FIG. 1 is a functional block diagram showing a schematic configuration of a recording/reproduction device as the first embodiment of the present invention.

EXPLANATION OF REFERENCE NUMERALS 1A, 1B, 1C, 1D, 1E recording/reproduction device
2 recording medium
3 driver part
11 first error correction coder
12 second error correction coder
21, 21P SISO demodulator (soft input soft output demodulator)
22A, 22B, 22C, 22D, 22E error correction decoding part
23, 43 SP converter (serial-parallel converter)
24 memory circuit
25 selection circuit
26 second error correction decoder
27 first error correction decoder
40 lost position detection part
41 extraction control part
42 gate circuit
44 error correction decoder
44s decoding status determination part
70 selection circuit

BEST MODE FOR CARRYING OUT THE INVENTION

The various embodiments of the present invention are now explained.

First Embodiment

FIG. 1 is a functional block diagram showing a schematic configuration of a recording/reproduction device 1A as the first embodiment of the present invention. The recording/reproduction device 1A has a function of recording input data (user data) Din in a recording medium 2, and a function of reproducing the recorded data Dout from the recording medium 2. The recording medium 2 may be, for example, optical discs such as a CD (Compact Disc), a DVD (Digital Versatile Disc), a BD (Blu-ray Disc) or an AOD (Advanced Optical Disc), or a holographic memory, a ferroelectric probe memory or an HD (hard disk), and there is no particular limitation. Incidentally, the error correction decoding technology explained below can also be applied to various fields, in addition to the field of recording/reproduction devices, which require error correction decoding.

The recording/reproduction device 1A includes an error correction coding part 10, a modulator 13, and a data adding part 14. The error correction coding part 10 includes a first error correction coder 11 and a second error correction coder 12. The error correction coding part 10 is supplied with input data Din to which a CRC code (Cyclic Redundancy Check code) was added thereto. The first error correction coder 11 creates an outer code as an algebraic error correction code such as a BCH code or an RS code (Reed-Solomon code), and adds this outer code to the input data Din. The second error correction coder 12 creates a series of code words formed from an LDPC code as an inner code based on the output series of the first error correction coder 11. Here, it is also possible to interpose an interleaver for interleaving the output of the first error correction coder 11 between the first error correction coder 11 and the second error correction coder 12, and interpose a de-interleaver for performing de-interleave of returning the order of the signals that were interleaved by the interleaver to the original order between the second error correction decoder 26 and the first error correction decoder 27. Otherwise, it is also possible to interpose an interleaver between the second error correction coder 12 and the modulator 13, and interpose a de-interleaver for performing de-interleave of returning the order of the signals that were interleaved by the interleaver to the original order between the demodulator 21 and the memory circuit 24. Incidentally, interleaving is also able to convert burst errors (continuously occurring errors) into random errors during the decoding process.

The modulator 13 modulates a code word series that is supplied from the second error correction coder 12 with a recording/modulation system that is compliant with the specifications of the recording medium 2. For instance, if the recording medium 2 is an optical disk, the modulator 13 is able to execute the publicly known RLL (Run-Length Limited) modulation, and if the recording medium 2 is a hologram memory, the modulator 13 is able to execute two-dimensional modulation such as the publicly known 2-4 modulation. The data adding part 14 creates a recording signal by adding a synchronization detection pattern or inserting a position correction marker to the modulated signal supplied from the modulator 13, and transfers the recording signal to the driver part 3. The driver part 3 writes the transferred recording signal into the recording medium 2.

Figure 2A:
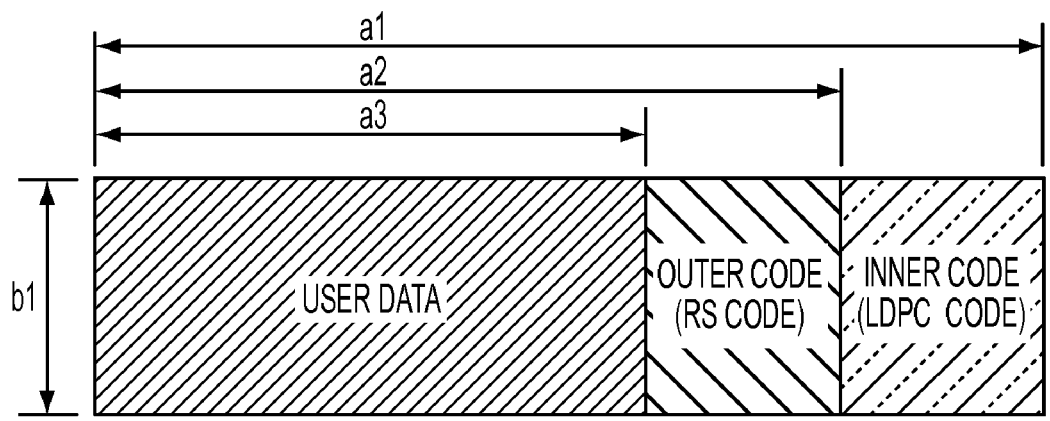
FIG. 2A and FIG. 2B are diagrams showing an example of an error correction code format of encoded data.
Figure 2B:
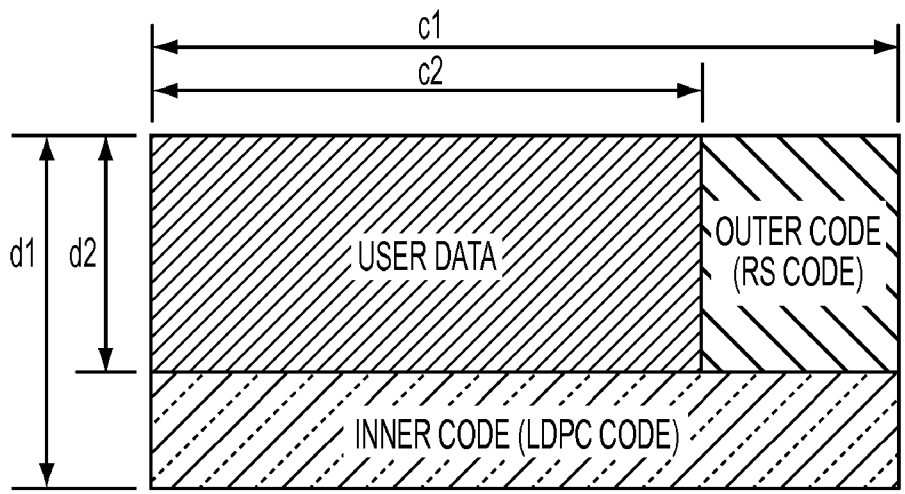
Figure 3:
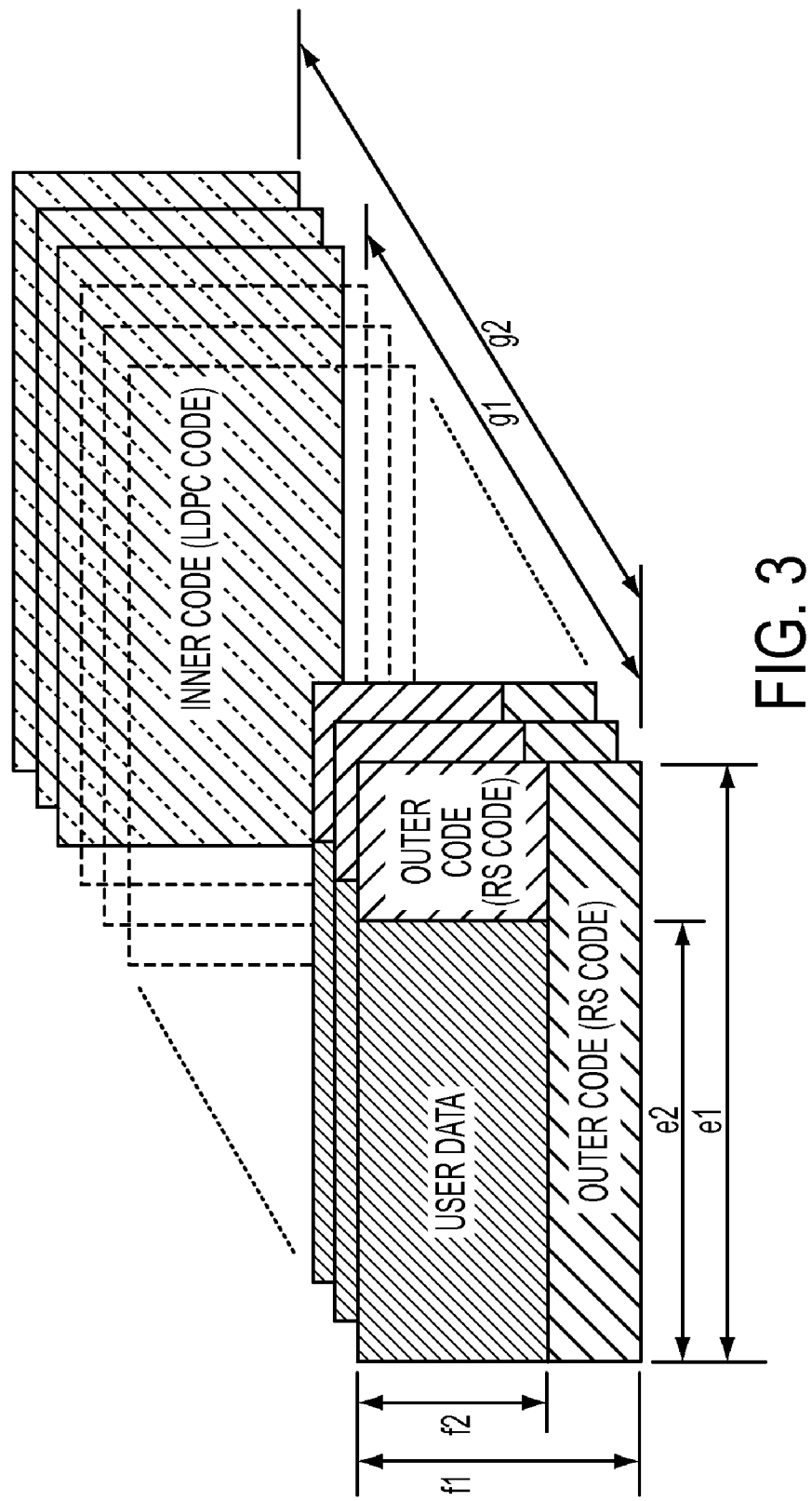
FIG. 3 is a diagram showing another example of an error correction code format of encoded data.

FIG. 2A, FIG. 2B and FIG. 3 are respective diagrams schematically showing an example of an error correction code format that may be created with the error correction coding part 10. With the error correction code format shown in FIG. 2A, the encoded data is formed from a data block configured from user data of b1 row×a3 column, an outer code block configured from an outer code (RS code) series of b1 row×(a2−a3) column, and an inner code block configured from an inner code (LDPC code) series of b1 row×(a1−a2) column. The data block, the outer code block and the inner code block are arranged serially, and the data block is arranged in an area of No. 0 column to No. (a3−1) column, the outer code block is arranged in an area of No. a3 column to No. (a2−1) column, and the inner code block is arranged in an area of No. a2 column to No. (a1−1) column, respectively.

With the error correction code format shown in FIG. 2B, the encoded data is formed from a data block configured from user data of d2 row×c2 column, an outer code block configured from an outer code (RS code) series of d2 row×(c1−c2) column, and an inner code block configured from an inner code (LDPC code) series of (d2−d1) row×c1 column. The data block and the outer code block are arranged serially, and the inner code block is arranged parallel to the data block and the outer code block. The data block is arranged in an area of No. 0 row to No. (d2−1) row and No. 0 column to No. (c2−1) column, the outer code block is arranged in an area of No. 0 row to No. (d2−1) row and No. c2 column to No. (c1−1) column, and the inner code block is arranged in an area of No. d2 row to No. (d1−1) row and No. 0 column to No. (c1−1) column, respectively.

The error correction code format shown in FIG. 3 is a format in which the code block of f1 row×e1 column is sequenced three dimensionally across g1 code blocks. Each of the code blocks of No. 0 to No. (g2−1) is formed from a data block configured from user data of f2 row×e2 column, a first outer code block configured from an outer code (RS code) series of f2 row×(e1−e2) column, and a second outer code block configured from an outer code (RS code) series of (f1−f2) row×e1 column. The first outer code block and the second outer code block configure an iterated code. The data block is arranged in an area of No. 0 row to No. (f2−1) row and No. 0 column to No. (e2−1) column, the first outer code block is arranged in an area of No. 0 row to No. (f2−1) row and No. e2 column to No. (e1−1) column, and the second outer code block is arranged in an area of No. f2 row to No. (f1−1) row and No. 0 column to No. (e1−1) column, respectively. Each of the remaining code blocks of No. g2 to No. (g1−1) is configured only from an inner code (LDPC code) series.

As shown in FIG. 1, the recording/reproduction device 1A includes, as functional blocks for reproducing the recorded data Dout from the recording medium 2, a driver part 3, an added data detection part 20, an SISO demodulator (soft input soft output demodulator) 21, and an error correction decoding part 22A. The error correction decoding part 22A includes a memory circuit 24, a selection circuit 25, a second error correction decoder 26, and a first error correction decoder 27. As described above, if an interleaver is provided between the first error correction coder 11 and the second error correction coder 12, a de-interleaver for returning the sequence of the interleaved demodulated signal to the original sequence is provided between the second error correction decoder 26 and the first error correction decoder 27.

The added data detection part 20 creates a reproduction sample value series by AD-converting the reproduction signal supplied from the driver part 3. Moreover, the added data detection part 20 detects the foregoing synchronization detection pattern or the position correction marker from the reproduction sample value series, and uses the synchronization detection pattern or the position correction marker to perform pre-processing such as synchronization processing and geometrical correction to the reproduction sample value series. The added data detection part 20 extracts the modulation sample value series from the pre-processed reproduction sample value series, and supplies the extracted modulation sample value series to the SISO demodulator 21.

The SISO demodulator 21 creates likelihood information Ld formed from a log likelihood ratio series as prior information representing the likelihood regarding the respective modulation sample values, and provides the likelihood information Ld to the error correction decoding part 22A. The function of the SISO demodulator 21 is realized, for example, by using the publicly known BCJR (Bahl-Cocke-Jelinek-Raviv) algorithm. Details regarding the BCJR algorithm are described, for instance, in the Non-Patent Document of "L. R. Bahl, J. Cocke, F. Jelinek and J. Raviv, "Opti-mal decoding of linear codes for minimizing symbol error rate," IEEE Trans. IT, Vol. 20, 1974."

In the error correction decoding part 22A, the memory circuit 24 temporarily stores the likelihood information Ld created with the SISO demodulator 21. The likelihood information Ld that was output from the memory circuit 24 is supplied to the second error correction decoder 26 via the selection circuit 25. The second error correction decoder 26 estimates the code word series based on the likelihood information Ld according to the decoding algorithm of the LDPC code, and supplies the series of the hard decision values (binary series) to the first error correction decoder 27. Although this embodiment uses the publicly known Sum-Product decoding method as the preferable decoding algorithm, the present invention is not limited thereto. The Sum-Product decoding method performs so-called repetitive decoding (repeated decoding) as described later.

Generally speaking, turbo coding is executed by two coders that are connected in parallel. Turbo decoding is executed by exchanging likelihood information (outer log likelihood) between two soft input soft output decoders corresponding respectively to each of the foregoing coders. Thus, turbo decoding also entails repetitive decoding. In this embodiment, although the second error correction coder 12 adopts the LDPC coding system and the second error correction decoder 26 creates a deduced word series according to the Sum-Product decoding method, the present invention is not limited thereto. So as long as it is possible to create a deduced word series by executing repetitive decoding, the second error correction decoder 26 may be any decoder that performs turbo decoding and other repetitive decoding (repeated decoding).

The first error correction decoder 27 has a function of executing algebraic error correction decoding to the hard decision value series supplied from the second error correction decoder 26, and detecting a lost bit (erasure) in symbol parts configured from predetermined bits. If a lost bit is detected, the first error correction decoder 27 creates an erasure flag Er indicating the position of the lost bit and supplies this to the selection circuit 25 and the second error correction decoder 26. In the foregoing case, the second error correction decoder 26 re-reads the data series of the log likelihood ratio from the memory circuit 24 according to the erasure flag Er. Simultaneously, the selection circuit 25 supplies the log likelihood ratio that does not correspond to the position of the lost bit in the data series read from the memory circuit 24 to the second error correction decoder 26 as is in accordance with the erasure flag Er, and supplies a predetermined value that invalidates the log likelihood ratio to the second error correction decoder 26 in substitute for the log likelihood ratio that corresponds to the position of the lost bit.

Figure 4:
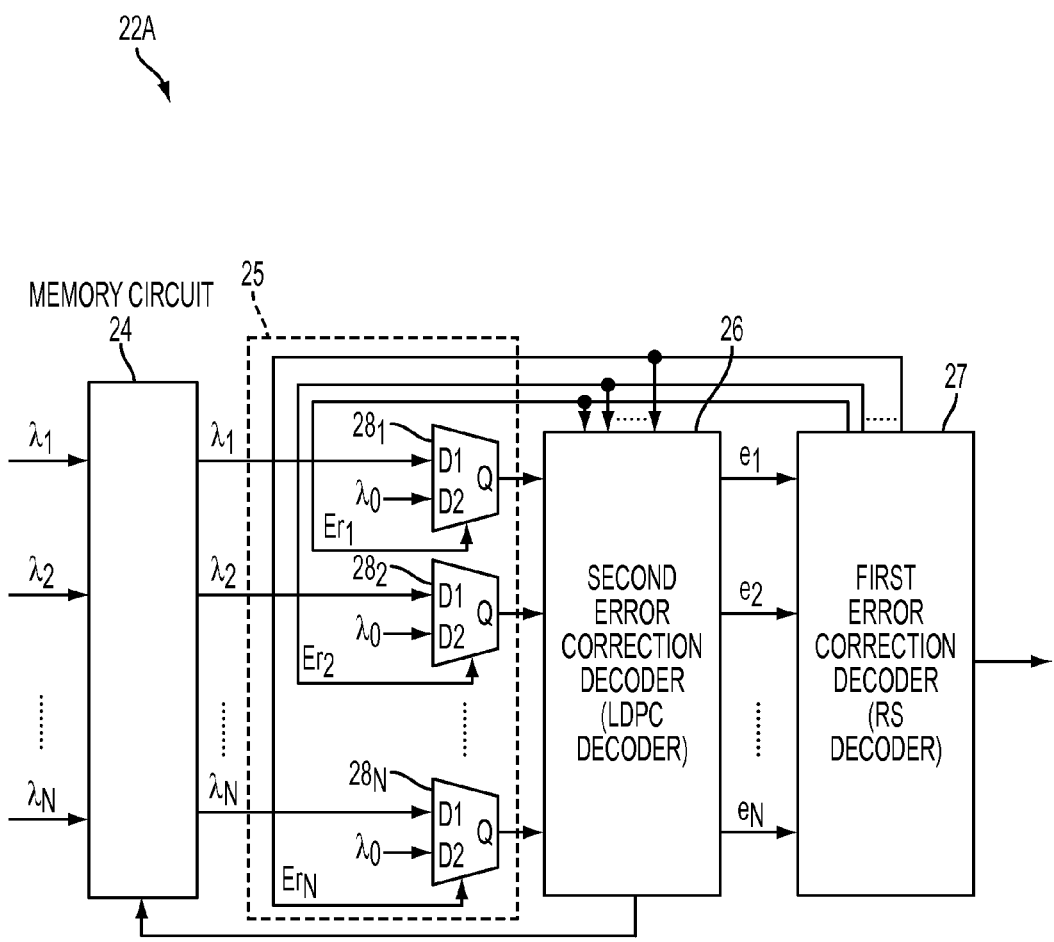
FIG. 4 is a block diagram showing a configuration of an error correction decoding part according to the first embodiment.

FIG. 4 is a diagram showing an example of the configuration of the error correction decoding part 22A. As shown in FIG. 4, N log likelihood ratios $\lambda_1, \ldots, \lambda_N$ are supplied for each code word in parallel from the SISO demodulator 21 to the memory circuit 24. Each log likelihood ratio $\lambda_k$ (k is an arbitrary integer from 1 to N) has a soft output value. The selection circuit 25 has N selectors $28_1, \ldots, 28_N$, and a corresponding log likelihood ratio $\lambda_1, \ldots, \lambda_N$ is input from the memory circuit 24 to one terminal D1 of the selectors $28_1, \ldots, 28_N$, and a predetermined value $\lambda 0$ is input to the other terminal D2. Moreover, a corresponding erasure flag $Er_1, \ldots, Er_N$ is supplied from the first error correction decoder 27 to the controlled terminal of the selectors $28_1, \ldots, 28_N$. Each selector $28_k$ (k is an arbitrary integer from 1 to N) selects either the log likelihood ratio $\lambda_k$ or the predetermined value $\lambda_0$ that invalidates the log likelihood ratio $\lambda_k$ according to the value ("0" or "1") of the erasure flag Erk, and supplies the selected value to the second error correction decoder 26.

The second error correction decoder 26 creates deduced words $e_1, \ldots, e_N$ by performing Sum-Product decoding to the likelihood information supplied from the selection circuit 25, and supplies the deduced words $e_1, \ldots, e_N$ to the first error correction decoder 27. The processing routine of the Sum-Product decoding method will be described later.

Figure 5:
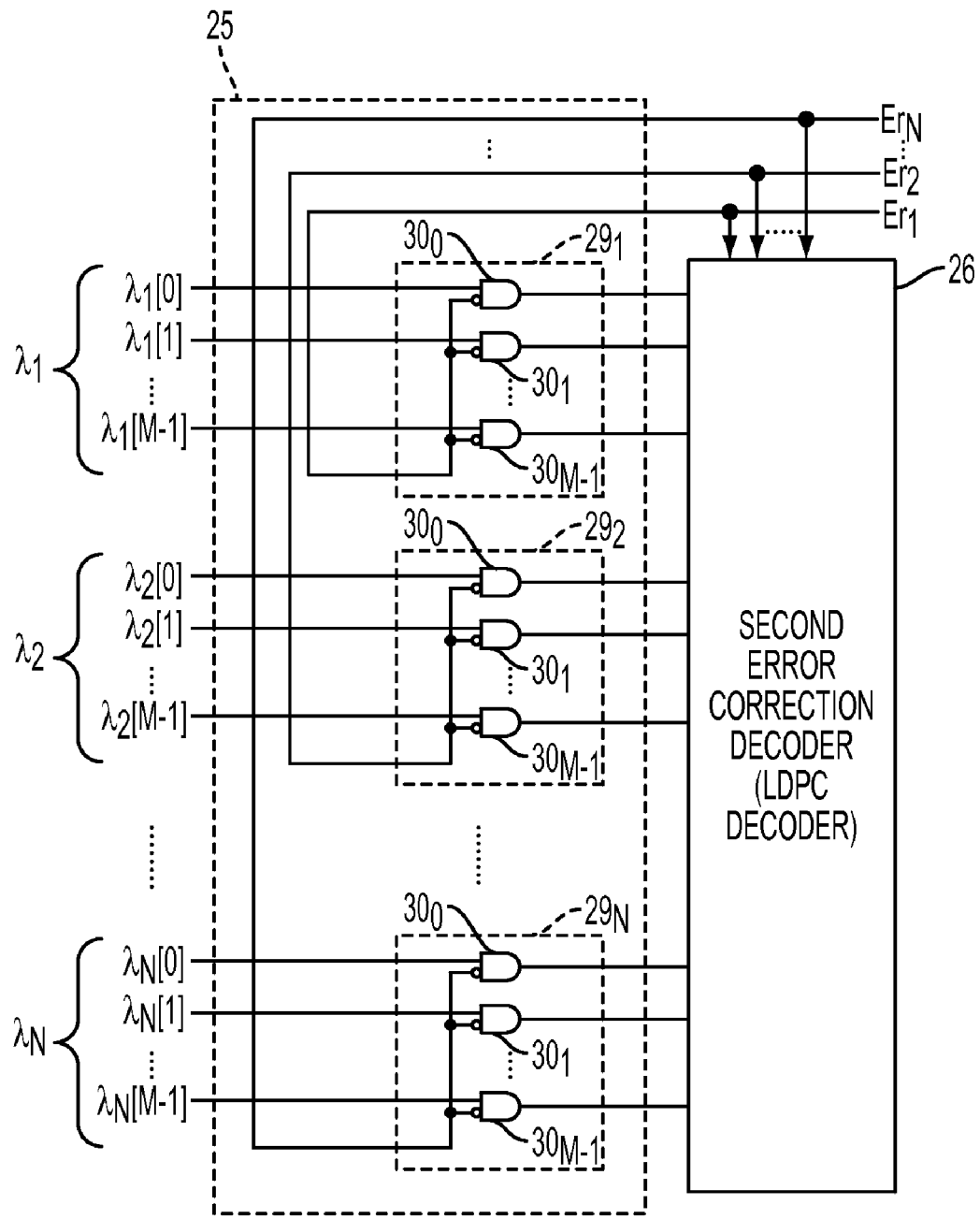
FIG. 5 is a block diagram showing a configuration of an error correction decoding part according to a modified example of the first embodiment.

In the configuration shown in FIG. 4, although the selection circuit 25 is configured from N selectors $28_1, \ldots, 28_N$, if the predetermined value $\lambda 0$ is "0" and the resolution of each log likelihood ratio $\lambda_k$ (k is an arbitrary integer from 1 to N) is M bits, as illustrated in FIG. 5, the selection circuit 25 may also be configured from N logic circuits $29_1$ to $29_N$. As shown in FIG. 5, each log likelihood ratio $\lambda_k$ is configured from M bits $\lambda_k[0]$ to $\lambda_k[M-1]$. Each logic circuit $29_k$ (k is an arbitrary integer from 1 to N) has M AND gates 300 to 30M−1 corresponding respectively to the bits $\lambda_k[0]$ to $\lambda_k[M-1]$. Each AND gate 30$i$ belonging to the logic circuit $29_k$ alternates the bit of the erasure flag Erk, performs logical AND operation to the alternating bit and the bit $\lambda_k[i]$ of the log likelihood ratio $\lambda_k$, and provides the operation result to the second error correction decoder 26.

Figure 6:
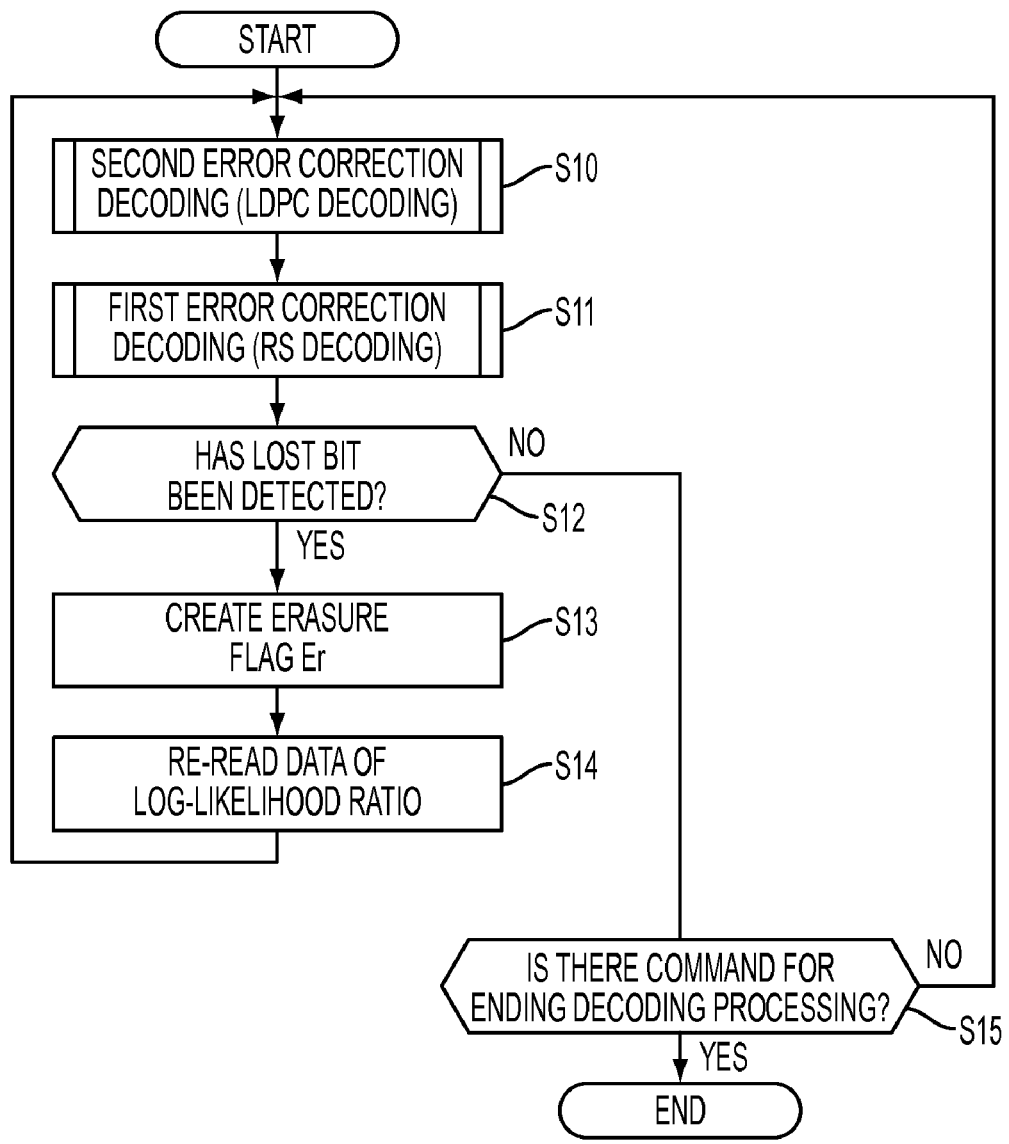
FIG. 6 is a flowchart schematically showing an operation routine of the error correction decoding part according to the first embodiment.

The processing routine of the foregoing error correction decoding part 22A is now explained with reference to FIG. 6 and FIG. 7. FIG. 6 is a flowchart schematically explaining a part of the processing routine to be performed by the error correction decoding part 22A.

When the second error correction decoder 26 receives data of the log likelihood ratios $\lambda_1$ to $\lambda_N$ from the selection circuit 25, it calculates the deduced words $e_1$ to $e_N$ by executing LDPC decoding based on the log likelihood ratios $\lambda_1$ to $\lambda_N$ (step S10). Here, the first error correction decoder 27 sets the value of the erasure flags $Er_1$ to $Er_N$ to be supplied to the selection circuit 25 to the initial value (="0"). Thus, the selection circuit 25 supplies the data of all log likelihood ratios $\lambda_1$ to $\lambda_N$ received from the memory circuit 24 to the second error correction decoder 26 as is.

Subsequently, the first error correction decoder 27 performs algebraic error correction decoding such as RS decoding to the deduced words $e_1$ to $e_N$, and outputs the decoding result as the user data Dout (step S11). If the first error correction decoder 27 detects a lost bit in the series of the deduced words $e_1$ to $e_N$ (step S12), the first error correction decoder 27 creates erasure flags $Er_1$ to $Er_N$ indicating the position of the lost bit, and thereafter supplies the created erasure flags $Er_1$ to $Er_N$ to the selection circuit 25 (step S13).

After the creation of the erasure flags $Er_1$ to $Er_N$ (step S13), the second error correction decoder 26 re-reads the log likelihood ratios $\lambda_1$ to $\lambda_N$ corresponding to the lost bit from the memory circuit 24 in code word parts (step S14). The re-read log likelihood ratios $\lambda_1$ to $\lambda_N$ are supplied to the selection circuit 25. The selection circuit 25 supplies the log likelihood ratio $\lambda_k$ to the second error correction decoder 26 if the value of the erasure flag Erk is "0," and supplies a predetermined value $\lambda 0$ to the second error correction decoder 26 in substitute for the log likelihood ratio $\lambda_k$ if the value of the erasure flag Erk is "1." Then, the second error correction decoder 26 returns to the processing of step S10 and executes LDPC decoding. The routine of steps S10 to S14 is thereafter repeatedly executed until it is determined that a lost bit is not detected at step S12.

If the first error correction decoder 27 does not detect a lost bit in the series of the deduced words $e_1$ to $e_N$ at step S12, and a controller (not shown) does not issue a command to end the decoding processing (step S15), the second error correction decoder 26 returns to step S10 and continues the LDPC decoding. Meanwhile, if a command for ending the decoding processing is issued (step S15), the foregoing decoding processing is ended.

The processing routine of the Sum-Product decoding (LDPC decoding) to be performed by the second error correction decoder 26 is now explained with reference to FIG. 7. FIG. 7 is a flowchart showing the processing routine of the Sum-Product decoding.

Figure 8:
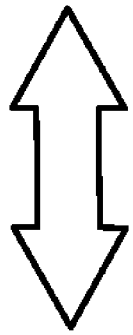
FIG. 8 is a diagram explaining the Sum-Product decoding method.
Figure 8:
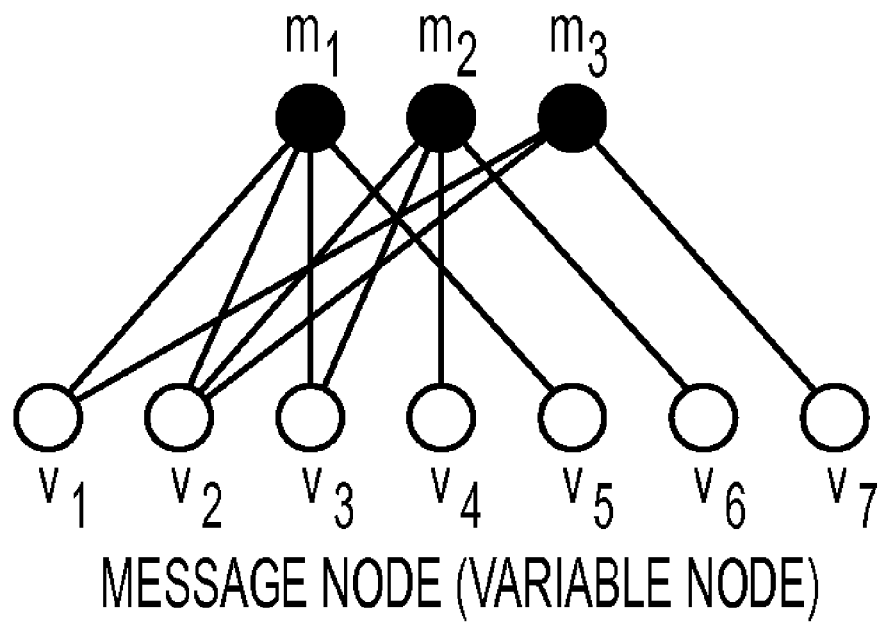

The LDPC code is a simulated random code that is created by using a non-dense parity check matrix H of M rows and N columns. Sum-Product decoding, which is one decoding method of the LDPC code, is a message passing algorithm that is expressed by using a Tanner graph (bigraph) configured from a parity check matrix H. FIG. 8 illustrates a Tanner graph configured from a parity check matrix H of 3 rows and 7 columns. As shown in FIG. 8, the Tanner graph is configured from variable nodes (message nodes) $v_1$ to $v_7$ respectively corresponding to the columns of the check matrix H, and check node $m_1$ to $m_3$ respectively corresponding to the rows of the check matrix H. With a Tanner graph, only when the element of i row and j column of the check matrix H is a non-zero element (=1), the distance between the jth variable node $v_j$ and the jth check node $m_j$ is connected with a line referred to as an "edge." The number of edges to be connected to the ith check node $m_i$ is equivalent to the humming weight (row weight) of i row of the check matrix H, and the number of edges to be connected to the jth variable node $v_j$ is equivalent to the humming weight (column weight) of j row of the check matrix H. It could be said that the Sum-Product decoding method is a method of calculating the approximate posterior probability in symbol units or bit units by exchanging messages in the foregoing Tanner graph.

Figure 7:
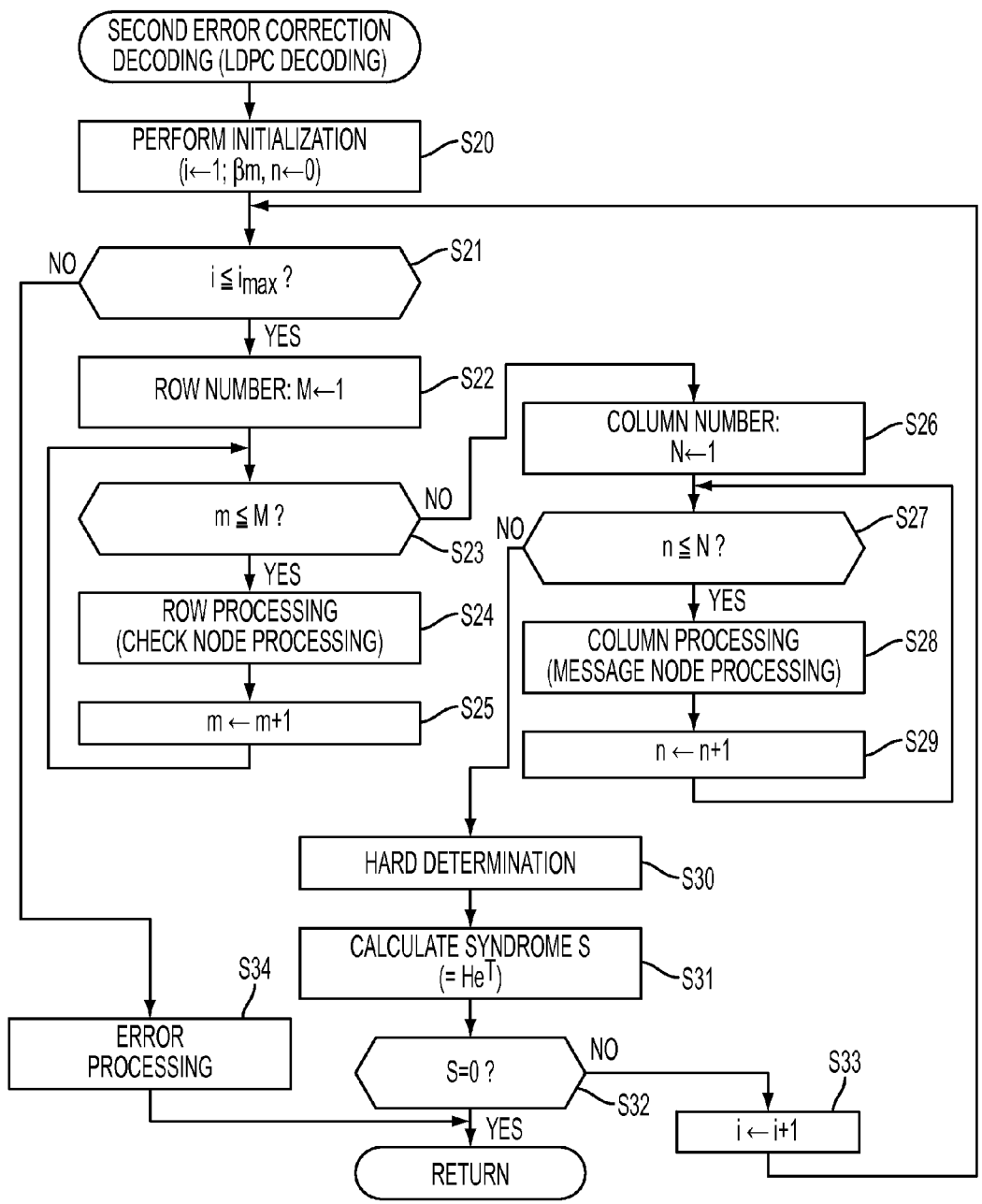
FIG. 7 is a flowchart showing a processing routine of a second error correction code according to the first embodiment.

Upon referring to FIG. 7, the second error correction decoder 26 performs initialization to the log likelihood ratios $\lambda_1$ to $\lambda_N$ of the respective code words (step S20). Here, the variable i representing the iteration count is set to "1," and all prior values (log prior value ratios) $\beta_{m,n}$ corresponding to the non-zero element of m row and n column of the check matrix H are set to "0." Incidentally, the log likelihood ratio $\lambda_k$ is generally defined by the following Formula (1).

$$\lambda_k := \ln \frac{P(c_k \mid x_k = 0)}{P(c_k \mid x_k = 1)}. \tag{1}$$

Here, $x_k$ represents the kth element of the original code word $x=(x_1, x_2, \ldots, x_N)$ created by the second error correction coder 12 (FIG. 1), and $c_k$ represents the kth elements of the code word $c=(c_1, c_2, \ldots, c_N)$ read from the recording medium 2. P (B|A) is the conditional probability that event B will occur when event A occurs.

If the recording system including the recording medium 2 is an AWGN (Additive White Gaussian Noise) channel, it is known that the log likelihood ratio $\lambda_k$ can be calculated based on the following Formula (1a).

$$\lambda_k = \ln \frac{P(c_k \mid x_k = 0)}{P(c_k \mid x_k = 1)} = \frac{2}{\sigma^2} c_k. \tag{1a}$$

Here, $\sigma^2$ is the dispersion of gaussian noise. Nevertheless, in reality, since factors such as modulated strain and jitter also affect the log likelihood ratio $\lambda_k$ in addition to the gaussian noise, it would be undesirable to use the log likelihood ratio $\lambda_k$ that is simply subject to only the AWGN channel. The SISO demodulator 21 shown in FIG. 1 is designed to create the likelihood information Ld so as to optimize the error correction performance of the LDPC decoding.

Subsequently, whether the variable i is less than or equal to the preset maximum iteration count imax is determined (step S21). If the variable i is less than or equal to the maximum iteration count imax, at steps S22 to S25, the outer values $\alpha m$, n are updated by executing row processing (check node processing) in the order of row number m=1, 2, ..., M. Specifically, it is determined whether at step S22 the row number m is set to "1" and whether at step S23 the row number m is M rows or less of the check matrix H. If the row number m is M rows or less of the check matrix H, the row processing regarding the mth row is executed (step S24), the row number m is incremented (step S25), and the processing returns to the routine of step S23.

More specifically, the row processing may be executed by calculating the outer values (log outer value ratios) $\alpha m$, n corresponding to the non-zero element of mth row and nth column of the check matrix H in the order of row number m=1, 2, ..., M according to the following Formula (2).

$$\alpha_{m,n} = \prod_{n' \in A(m)\setminus n} \text{sign}(\lambda_{n'} + \beta_{m,n'}) \cdot \phi\left(\sum_{n' \in A(m)\setminus n} \phi(|\lambda_{n'} + \beta_{m,n'}|)\right). \tag{2}$$

Here, A(m) is a set of the column number (column index) corresponding to a non-zero element existing in the mth row of the check matrix H. A(m)\n represents a set in which the element n has been removed from the set A(m). With the Tanner graph shown in FIG. 8, for example, A(1)={1, 2, 3, 5}, and A(1)\1={2, 3, 5}.

The function sign (x) in foregoing Formula (1) is defined by the following Formula (3).

$$\text{sign}(x) := \begin{cases} +1, & \text{for } x \geq 0 \\ -1, & \text{for } x < 0 \end{cases} \tag{3}$$

In addition, the function φ (x) in foregoing Formula (1) is referred to as the Gallager function, and is defined by the following Formula (4).

$$\phi(x) := \ln\frac{\exp(x)+1}{\exp(x)-1} = \ln\left(\tanh\left(\frac{-x}{2}\right)\right). \tag{4}$$

Figure 9A:
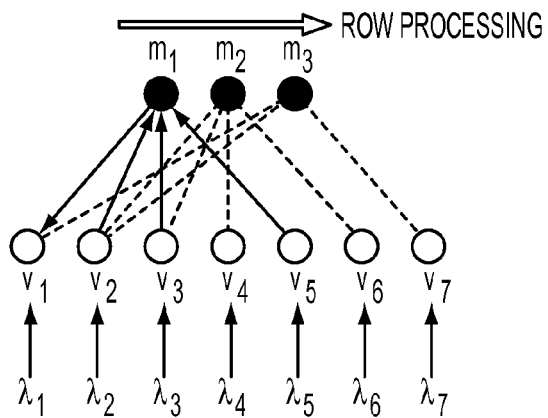
FIG. 9A to FIG. 9C are diagrams explaining the message passing algorithm of the Sum-Product decoding method.
Figure 9B:
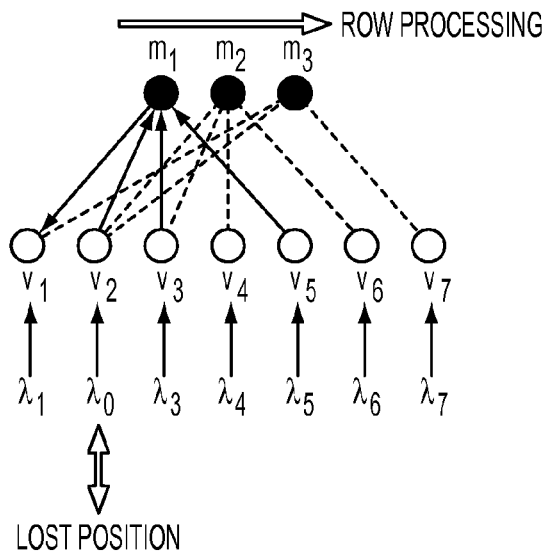

To explain the calculation method of the outer value $\alpha_{1,1}$ using the Tanner graph, as shown in FIG. 9A, log likelihood ratios $\lambda_1$ to $\lambda_N$ are respectively provided to the variable nodes $v_1$ to $v_N$. The check node $m_1$ calculates the outer values $\alpha_{1,1}$ based on a message supplied, via the edge, from the variable nodes (message nodes) $v_2$, $v_3$, v5 designated in the set A(1)\1. The variable node $v_1$ updates the old outer value with the new outer value $\alpha_{1,1}$ supplied from the check node $m_1$. Meanwhile, if the first error correction decoder 27 (FIG. 1) detects a lost bit only at the 2nd position of the code word (step S13 of FIG. 6), the value of the erasure flag $Er_2$ is set to "1," and the value of the other erasure flags $Er_1$, $Er_3$ to $Er_7$ is set to "0." Here, as shown in FIG. 9B, a predetermined value $\lambda_0$ is provided to the variable node $v_2$, and the log likelihood ratios $\lambda_1$, $\lambda_3$ to $\lambda_N$ are respectively provided to the other variable nodes $v_1$, $v_3$ to $v_N$.

Subsequently, at steps S26 to S29, the prior value βm, n is updated by executing column processing (message node processing) in the order of column number n=1, 2, . . . , N. Specifically, it is determined whether at step S26 the column number n is set to "1" and whether at step S27 the column number n is N columns or less of the check matrix H. If the column number n is N columns or less of the check matrix H, column processing regarding the nth column is executed (step S28), the column number n is incremented (step S29), and the processing returns to the routine of step S27.

More specifically, the column processing can be executed by calculating the prior value $\beta_{m,n}$ corresponding to the non-zero element of mth row and nth column of the check matrix H in the order of column number n=1, 2, . . . , N according to the following Formula (5).

$$\beta_{m,n} = \prod_{m' \in B(n)\backslash m} \alpha_{m',n} \tag{5}$$

Figure 9C:
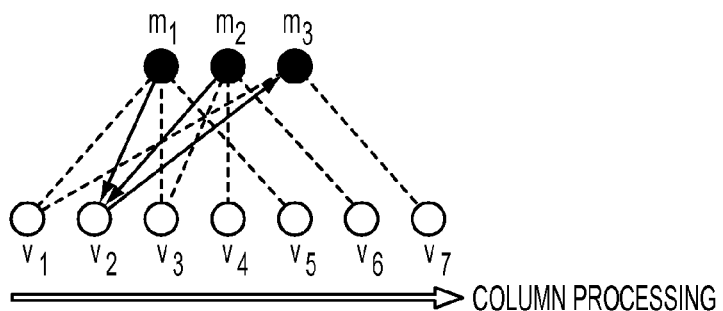

Here, B(n) is a set of the row number (row index) corresponding to the non-zero number existing in the nth column of the check matrix H. B(n)\m represents a set in which the element m has been removed from the set B(n). With the Tanner graph shown in FIG. 8, for example, B(2)={1, 2, 3}, and B(2)\3={1, 2}. To explain the calculation method of the prior value $\beta_{2,3}$ using the Tanner graph, as shown in FIG. 9C, the variable node $v_2$ calculates the prior value $\beta_{2,3}$ based on a message supplied, via the edge, from the check nodes $m_1$, $m_2$ designated in the set B(2)\3. The check node $m_3$ updates the old prior value with the new prior value $\beta_{2,3}$ supplied from the variable node $v_2$.

After the routine of foregoing steps S26 to S29 is complete, temporary deduced words e=($e_1$, $e_2$, . . . , $e_N$) are calculated based on hard decision (step S30). Specifically, the temporary deduced words $e_k$ can be calculated according to the following Formula (6).

$$e_k = \begin{cases} 0, & \text{if sign}\left(\lambda_k + \sum_{m' \in B(k)} a_{m',k}\right) = +1 \\ 1, & \text{if sign}\left(\lambda_k + \sum_{m' \in B(k)} a_{m',k}\right) = -1 \end{cases} \tag{6}$$

Subsequently, the check matrix H and the temporary deduced words e=($e_1$, $e_2$, . . . , $e_N$) are used to calculate the syndrome S=H·eT according to the following Formula (7) (step S31).

$$S = H \cdot (e_1, e_2, \ldots, e_n)^T = (0,0,\ldots,0)^T. \tag{7}$$

Here, T is a transposition symbol, and $e^T$ is a matrix of N row and 1 column obtained by transposing the vector e=($e_1$, $e_2$, . . . , $e_N$) as the matrix of 1 row and N column representing the temporary deduced words. If the second error correction decoder 26 determines that the syndrome S includes a non-zero element (step S32), it increments the variable i (step S33), and returns the processing to step S21. When the variable i exceeds the maximum iteration count imax (step S21), the second error correction decoder 26 executes error processing such as creating an error flag (step S34), and thereby ends the decoding processing. Meanwhile, if the second error correction decoder 26 determines that all elements of the syndrome S are zero (step S32), it outputs the temporary deduced word e as the deduced word, and thereby ends the decoding processing.

Although the Gallager function φ (x) is used in the foregoing row processing (step S24), the hardware design for calculating the value of the Gallager function is not easy. Thus, it would be realistic to use a look-up table (LUT) storing the function values, but an LUT requires enormous memory capacity. In light of the above, if it is desirable to execute simple row processing with a small memory capacity, it is desirable to approximate the Gallager function φ (x). The approximate value of the outer value αm, n can be calculated according to the following approximation Formulas (7a), (7b).

$$\alpha_{m,n} \cong \frac{1}{A} \prod_{n' \in A(m)\backslash n} \text{sign}\left(\frac{\lambda_{n'} +}{\beta_{m,n'}}\right) \cdot \min_{n' \in A(m)\backslash n} (|\lambda_{n'} + \beta_{m,n'}|) - c. \tag{7a}$$

$$\alpha_{m,n} \cong \prod_{n' \in A(m)\backslash n} \text{sign}(q) \cdot \max(|q| - B, 0), \tag{7b}$$

where $$q = \prod_{n' \in A(m)\backslash n} \text{sign}(\lambda_{n'} + \beta_{m,n'}) \cdot \min_{n' \in A(m)\backslash n} (|\lambda_{n'} + \beta_{m,n'}|).$$

In Formula (7a), A is a non-zero normalizing constant, and c is an arbitrary constant. In Formula (7b), B is an offset constant.

As described above, with the decoding algorithm (Sum-Product decoding method) of the LDPC code, it is not possible to detect the accurate position of a lost bit. However, with algebraic error correction decoding such as RS decoding, it is possible to detect the accurate position of a lost bit. With the error correction decoding part 22A according to the first embodiment, the second error correction decoder 26 uses the erasure flag Er indicating the accurate position of the lost bit to execute the repetitive decoding without using the unreliable likelihood information Ld. Therefore, in comparison to conventional technology, it is possible to realize error correction decoding with extremely high performance of correcting random errors and burst errors. In addition, it is also possible to perform highly sophisticated error correction to a data series which could not be corrected with conventional technology.

Figure 10:
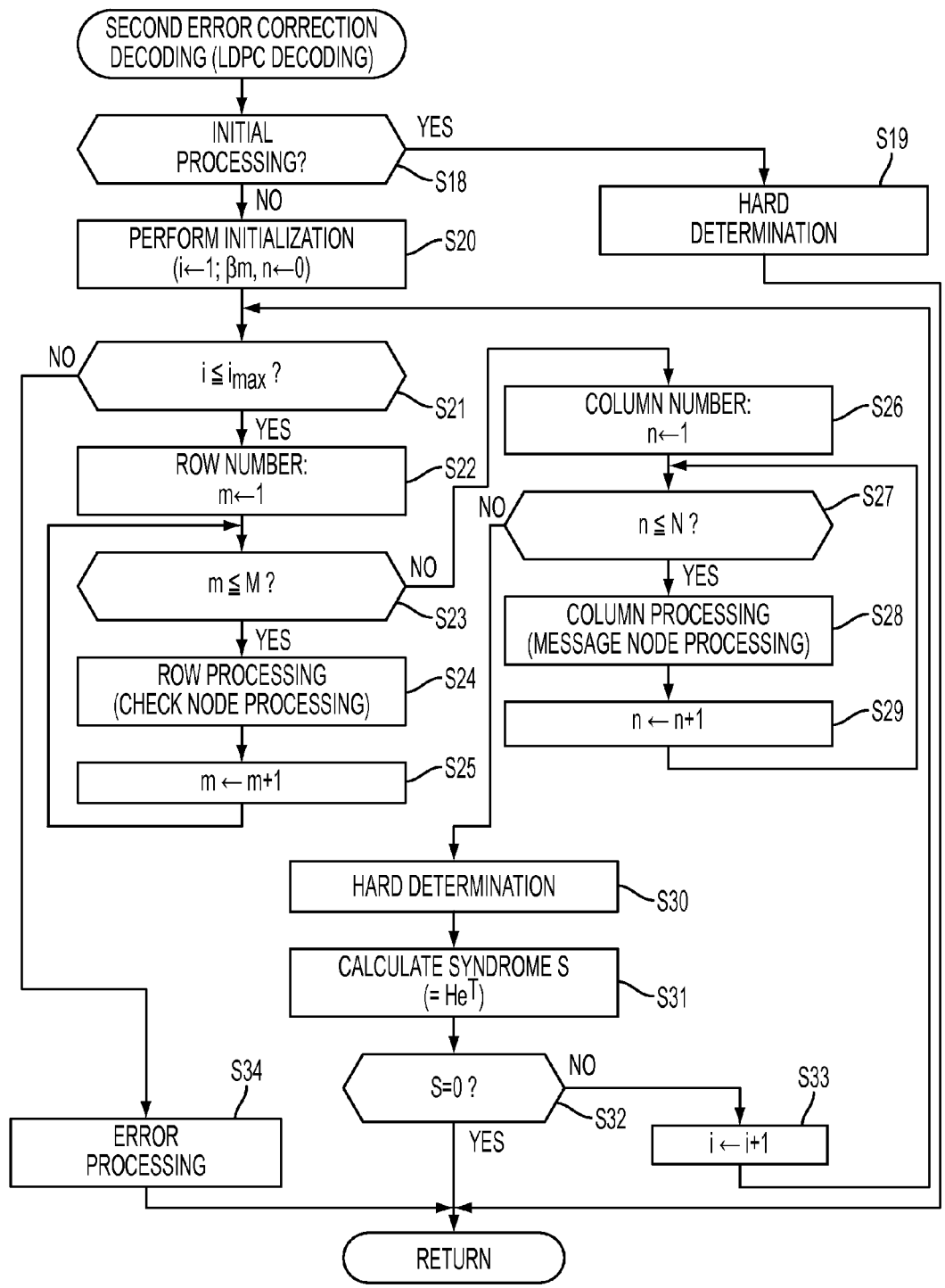
FIG. 10 is a flowchart showing a processing routine of a second error correction code according to a modified example of the first embodiment.

The decoding algorithm according to a modified example of the foregoing first embodiment is now explained. FIG. 10 is a flowchart showing the routine of the decoding processing to be performed by the second error correction decoder 26. The flowchart of FIG. 10 includes steps S20 to S33 shown in FIG. 7, and is characterized in that steps S18, S19 have been added before step S20.

Upon referring to FIG. 10, at step S18, the second error correction decoder 26 determines whether the current decoding processing is the initial processing regarding the log likelihood ratios $\lambda_1$ to $\lambda_N$ read the first time from the memory circuit 24. If the second error correction decoder 26 determines that the current decoding processing is the initial processing (step S18), it creates temporary deduced words e=($e_1$, $e_2$, ..., $e_N$) based on hard decision and supplies the temporary deduced words e to the first error correction decoder 27 as is (step S19). Thus, upon performing the initial decoding processing, the standard LDPC decoding routine (step S20 to S33) is skipped. In the hard decision at step S18, the temporary deduced words e can be calculated according to foregoing Formula (6) upon setting all outer values αm, n to zero.

In the foregoing case, the first error correction decoder 27 executes error correction decoding to a series of the temporary deduced words $e_1$ to $e_N$ supplied from the second error correction decoder 26 (step S11 of FIG. 6). If a lost bit is not detected in the series of the temporary deduced words $e_1$ to $e_N$ (step S12), and a controller (not shown) does not issue a command for ending the decoding processing (step S15), the second error correction decoder 26 returns to step S10 and continues the LDPC decoding.

Meanwhile, if the first error correction decoder 27 detects a lost bit in the series of the temporary deduced words $e_1$ to eN (step S12), the first error correction decoder 27 creates erasure flags $Er_1$ to $Er_N$ (step S13). Subsequently, the second error correction decoder 26 re-reads the log likelihood ratios $\lambda_1$ to $\lambda_N$ from the memory circuit 24 in code word units (step S14 of FIG. 6). The re-read log likelihood ratios $\lambda_1$ to $\lambda_N$ are supplied to the selection circuit 25. The selection circuit 25 supplies the log likelihood ratio $\lambda_k$ to the second error correction decoder 26 when the value of the erasure flag Erk is "0," and supplies a predetermined value $\lambda 0$ to the second error correction decoder 26 in substitute for the log likelihood ratio $\lambda_k$ when the value of the erasure flag Erk is "1."

The second error correction decoder 26 thereafter returns to the processing of step S10 and executes the LDPC decoding (FIG. 10). Here, the second error correction decoder 26 determines that the current decoding processing regarding the re-read log likelihood ratios $\lambda_1$ to $\lambda_N$ is not the initial processing (step S18), and thereafter executes the routine of steps S20 to S33.

As described above, when the second error correction decoder 26 is to perform the initial decoding processing for each code word, the standard LDPC decoding routine (step S20 to S33) is skipped. Thus, the second error correction decoder 26 is able to cause the first error correction decoder 27 to create the erasure flags $Er_1$ to $Er_N$ in a short period of time. Accordingly, the processing time can be shortened and the throughput can be improved.

Second Embodiment

Figure 11:
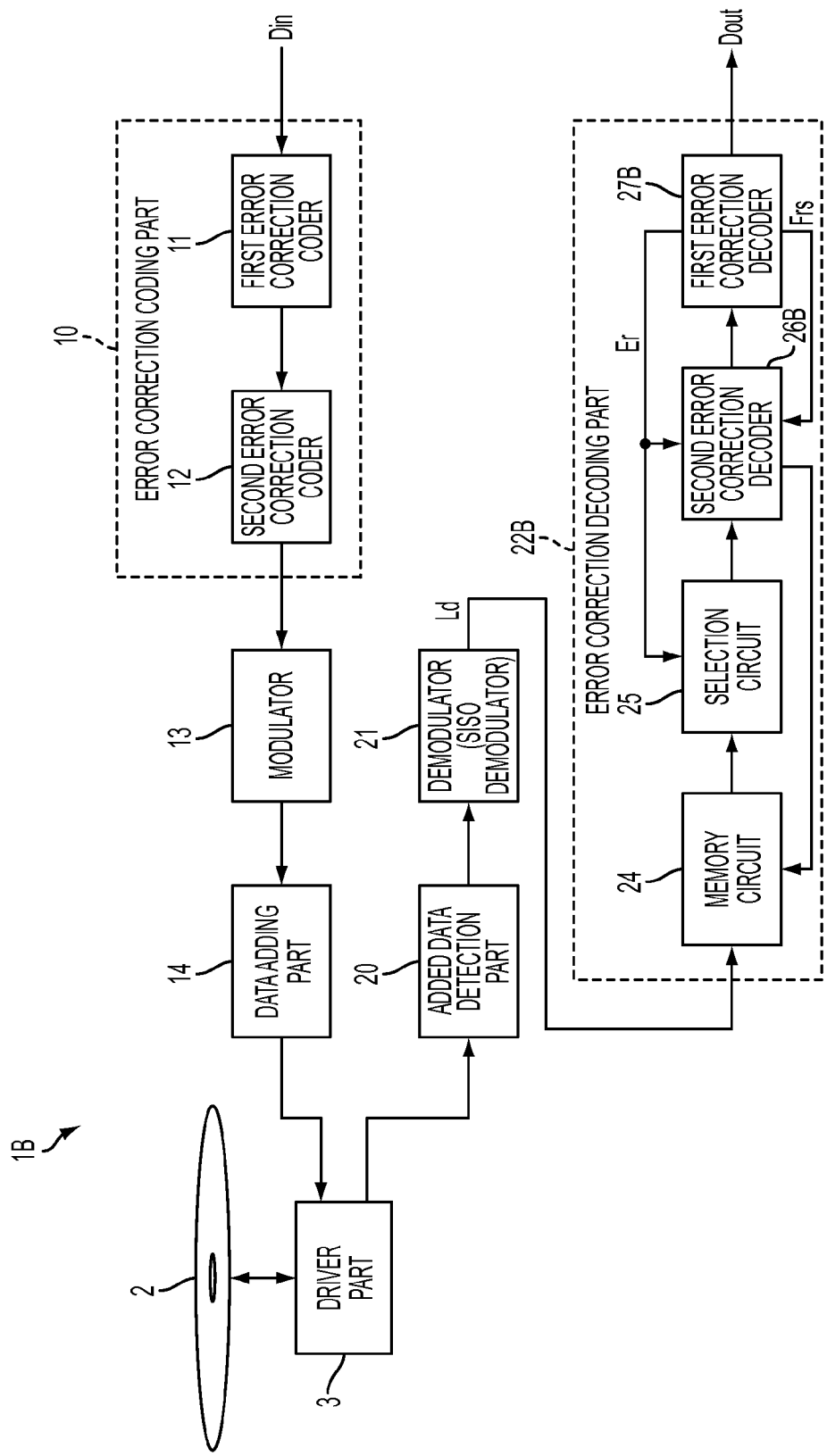
FIG. 11 is a functional block diagram showing a schematic configuration of a recording/reproduction device as the second embodiment of the present invention.

The second embodiment of the present invention is now explained. FIG. 11 is a functional block diagram showing the schematic configuration of a recording/reproduction device 1B as the second embodiment. The recording/reproduction device 1B is configured the same as the recording/reproduction device 1A (FIG. 1) of the first embodiment excluding the configuration of the error correction decoding part 22B. The error correction decoding part 22B includes a memory circuit 24, a selection circuit 25, a second error correction decoder 26B, and a first error correction decoder 27B. The configuration of the memory circuit 24 and the selection circuit 25 of the error correction decoding part 22B is the same as the configuration of the memory circuit 24 and the selection circuit 25 of the error correction decoding part 22A of the first embodiment.

Figure 12:
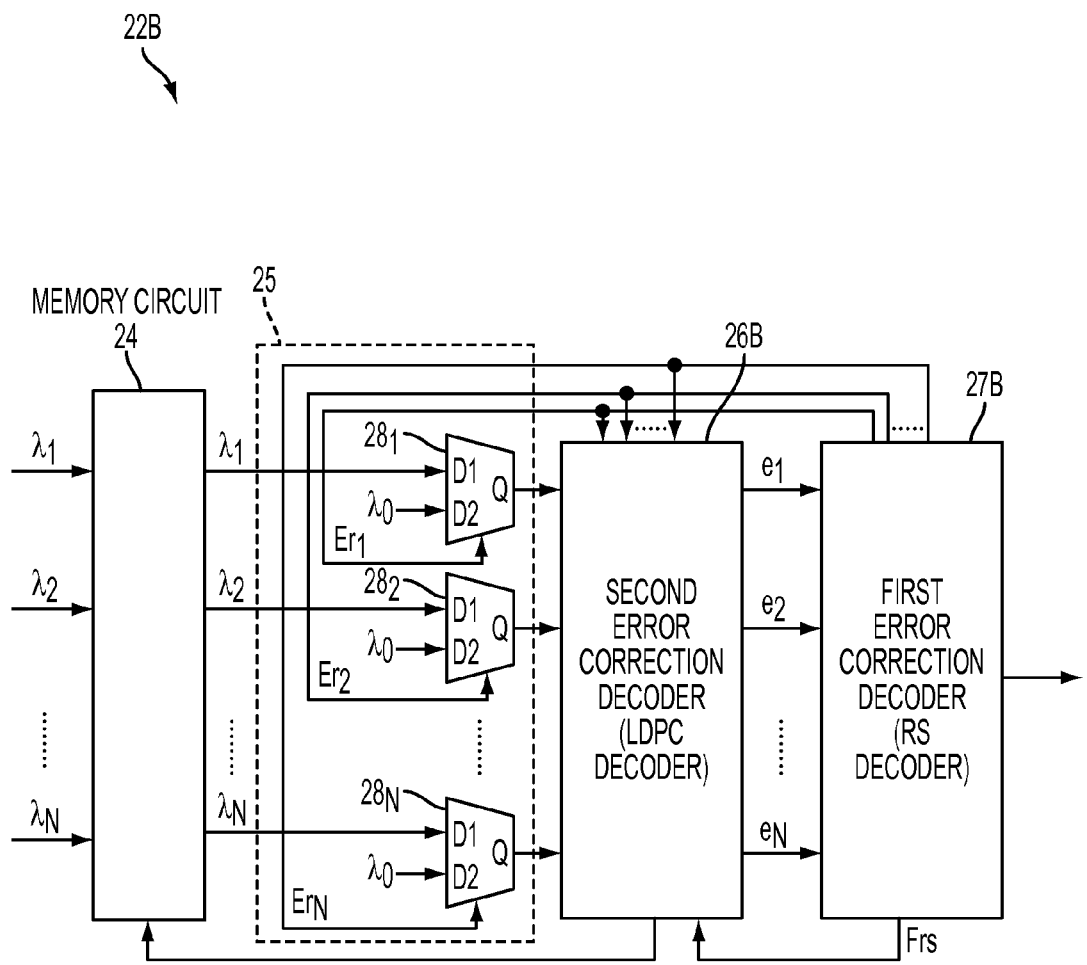
FIG. 12 is a block diagram showing a configuration of an error correction decoding part according to the second embodiment.

FIG. 12 is a diagram showing an example of the configuration of the error correction decoding part 22B of the second embodiment. As shown in FIG. 12, N log likelihood ratios $\lambda_1, \ldots, \lambda_N$ are supplied for each code word in parallel from the SISO demodulator 21 to the memory circuit 24. The selection circuit 25 is configured the same as the selection circuit 25 shown in FIG. 4. If the predetermined value $\lambda 0$ is set to "0," in substitute for the configuration of the selection circuit 25 shown in FIG. 12, the N logic circuits $29_1$ to $29_N$ shown in FIG. 5 may also be used.

As with the second error correction decoder 26 (FIG. 5) of the first embodiment, the second error correction decoder 26B creates hard decision values $e_1, e_2, \ldots, e_N$ by estimating the code word series based on the likelihood information Ld according to the decoding algorithm of the LDPC code, and supplies the hard decision values to the first error correction decoder 27B.

As with the first error correction decoder 27 (FIG. 4) of the first embodiment, the first error correction decoder 27B has a function of executing algebraic error correction decoding to the series of the hard decision values $e_1, e_2, \ldots, e_N$, and detecting a lost bit (erasure) in symbol units configured from predetermined bits. If the first error correction decoder 27B detects a lost bit, it creates an erasure flag Er, and additionally creates a status flag Frs having a value (=1) showing that the decoding processing has been executed. The status flag Frs is supplied to the second error correction decoder 26B.

If a lost bit is detected, the second error correction decoder 26B re-reads the log likelihood ratios $\lambda_1$ to $\lambda_N$ from the memory circuit 24 according to the erasure flags $Er_1$ to $Er_N$ supplied from the first error correction decoder 27B. Simultaneously, the selection circuit 25 supplies the log likelihood ratio λi that does not correspond to the position of the lost bit among the log likelihood ratios $\lambda_1$ to $\lambda_N$ read from the memory circuit 24 to the second error correction decoder 26B as is in accordance with the erasure flags $Er_1$ to ErN, and supplies a predetermined value $\lambda_0$ that invalidates the log likelihood ratio $\lambda_j$ to the second error correction decoder 26 in substitute for the log likelihood ratio $\lambda_j$ that corresponds to the position of the lost bit.

Figure 13:
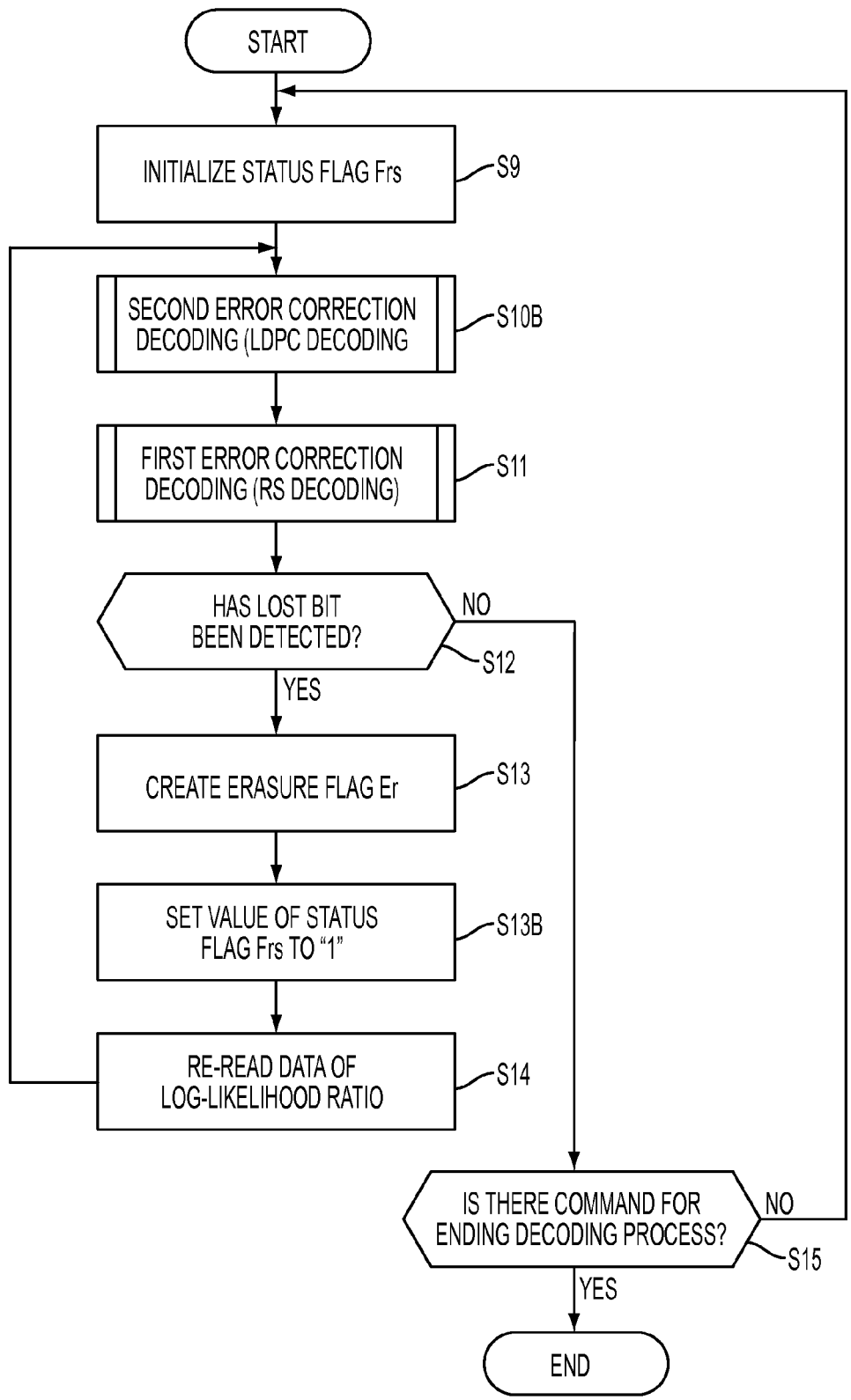
FIG. 13 is a flowchart schematically showing an operation routine of an error correction decoding part according to the second embodiment.

The processing routine of the foregoing error correction decoding part 22B is now explained with reference to FIG. 13 and FIG. 14. FIG. 13 is a flowchart schematically explaining a part of the processing routine to be performed by the error correction decoding part 22B, and FIG. 14 is a flowchart showing the processing routine of the second error correction decoding (LDPC decoding) to be executed at step S10B of FIG. 13.

Foremost, the first error correction decoder 27B initializes the status flag Frs and set the status flag Frs to a value other than "1" (step S9). When the second error correction decoder 26B receives data (data read the first time) of the log likelihood ratios $\lambda_1$ to $\lambda_N$ from the memory circuit 24 via the selection circuit 25, it calculates the temporary deduced words $e_1$ to $e_N$ by executing the LDPC decoding based on the log likelihood ratios $\lambda_1$ to $\lambda_N$ (step S10B). Here, the first error correction decoder 27B sets the value of the erasure flags $Er_1$ to $Er_N$ to be supplied to the selection circuit 25 to the initial value (="0"). Thus, the selection circuit 25 supplies the data of all log likelihood ratios $\lambda_1$ to $\lambda_N$ received from the selection circuit 25 to the second error correction decoder 26B as is.

Figure 14:
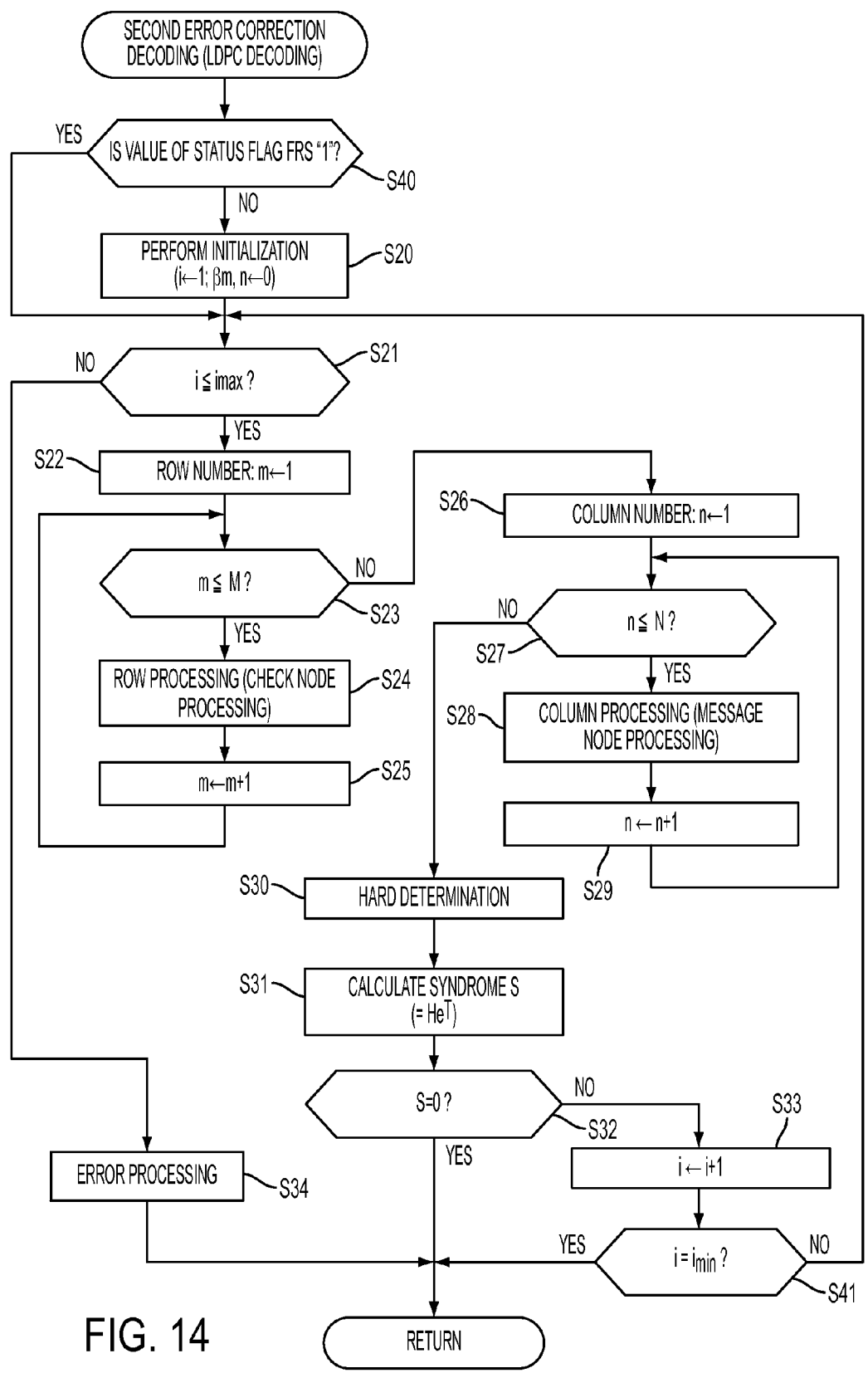
FIG. 14 is a flowchart showing a processing routine of a second error correction code according to the second embodiment.

In the foregoing case, upon referring to FIG. 14, the second error correction decoder 26B determines whether the value of the status flag Frs is a value other than "1" (step S40). Subsequently, the same routine as the LDPC decoding (step S20 to S34) shown in FIG. 7 is executed. At step S32, if the second error correction decoder 26B determines that the syndrome S includes a non-zero element, it increments the variable i (step S33), and thereafter determines whether the variable i coincides with a predetermined limit imin (for instance, once or twice) (step S41). If it is determined that the variable i coincides with the limit imin, the second error correction decoder 26B outputs the temporary deduced words $e=(e_1, \ldots, e_N)$. Meanwhile, it is determined that the variable i does not coincide with the limit imin, the second error correction decoder 26B returns the processing to step S21.

Thus, if all elements of the syndrome S become zero before the iteration count i reaches the limit imin (step S32), the second error correction decoder 26B outputs the deduced words $e=(e_1, \ldots, e_N)$, and, if the iteration count i reaches the limit imin before all elements of the syndrome S become zero, the second error correction decoder 26B outputs the temporary deduced words $e=(e_1, \ldots, e_N)$. The user can set the limit imin to an arbitrary value.

Returning to the flowchart of FIG. 13, the first error correction decoding is subsequently executed (step S11). Specifically, the first error correction decoder 27B performs algebraic error correction decoding such as RS decoding to the series of the hard decision value as the temporary deduced words or deduced words supplied from the second error correction decoder 26B, and outputs the decoding result as the user data Dout. If the first error correction decoder 27B detects a lost bit in the hard decision value series (step S12), the first error correction decoder 27B creates the erasure flags $Er_1$ to $Er_N$ indicating the position of the lost bit and supplies the erasure flags $Er_1$ to $Er_N$ to the selection circuit 25 (step S13). Moreover, the first error correction decoder 27B sets the value of the status flag Frs to "1" (step S13B).

After the setting of the status flag Frs (step S13B), the second error correction decoder 26B re-reads the log likelihood ratios $\lambda_1$ to $\lambda_N$ corresponding to the lost bit from the memory circuit 24 in code word units (step S14). Data (data read the second time) of the re-read log likelihood ratios $\lambda_1$ to $\lambda_N$ is supplied to the selection circuit 25. The selection circuit 25 supplies the log likelihood ratio $\lambda_k$ to the second error correction decoder 26B when the value of the erasure flag Erk is "0" and supplies a predetermined value $\lambda 0$ to the second error correction decoder 26B in substitute for the log likelihood ratio $\lambda_k$ when the value of the erasure flag Erk is "1." Subsequently, the second error correction decoder 26B returns the processing to step S10B and executes the LDPC decoding.

In the foregoing case, upon referring to FIG. 14, the second error correction decoder 26B determines that the value of the status flag Frs is "1" (step S40). Here, the initialization of step S20 is skipped and the same routine as the LDPC decoding (step S21 to S34) shown in FIG. 7 is executed. At step S32, if the second error correction decoder 26B determines that the syndrome S includes a non-zero element (step S32), it increments the variable i (step S33), and, since it will thereafter determine that the variable i does not coincide with the limit imin (step S41), the second error correction decoder 26B returns the routine to step S21. Then, the decoding processing is repeatedly executed until it is determined that the variable i exceeded the maximum iteration count imax or that all elements of syndrome S will be zero (step S21, S32).

Returning to the flowchart of FIG. 13, the routine of steps S10B to S14 is thereafter repeatedly executed until it is determined that a lost bit is not detected at step S12. If the first error correction decoder 27B does not detect a lost bit in the series of the hard decision values $e_1$ to $e_N$ at step S12 and a controller (not shown) does not issue a command for ending the decoding processing (step S15), the second error correction decoder 26B returns to step S9 and continues the LDPC decoding. Meanwhile, if a command for ending the decoding processing is issued (step S15), the foregoing decoding processing is ended.

As described above, the second error correction decoder 26B outputs the temporary deduced words before the iteration count i reaches the limit imin even in cases where all elements off the syndrome S will not become zero (step S32 of FIG. 14) with respect to the log likelihood ratios $\lambda_1$ to $\lambda_N$ read the first time from the memory circuit 24 (step S41). Thus, the second error correction decoder 26B is able to cause the first error correction decoder 27B to create the erasure flags $Er_1$ to $Er_N$ in a short period of time. Accordingly, the processing can be shortened and the throughput can be improved.

Third Embodiment

Figure 15:
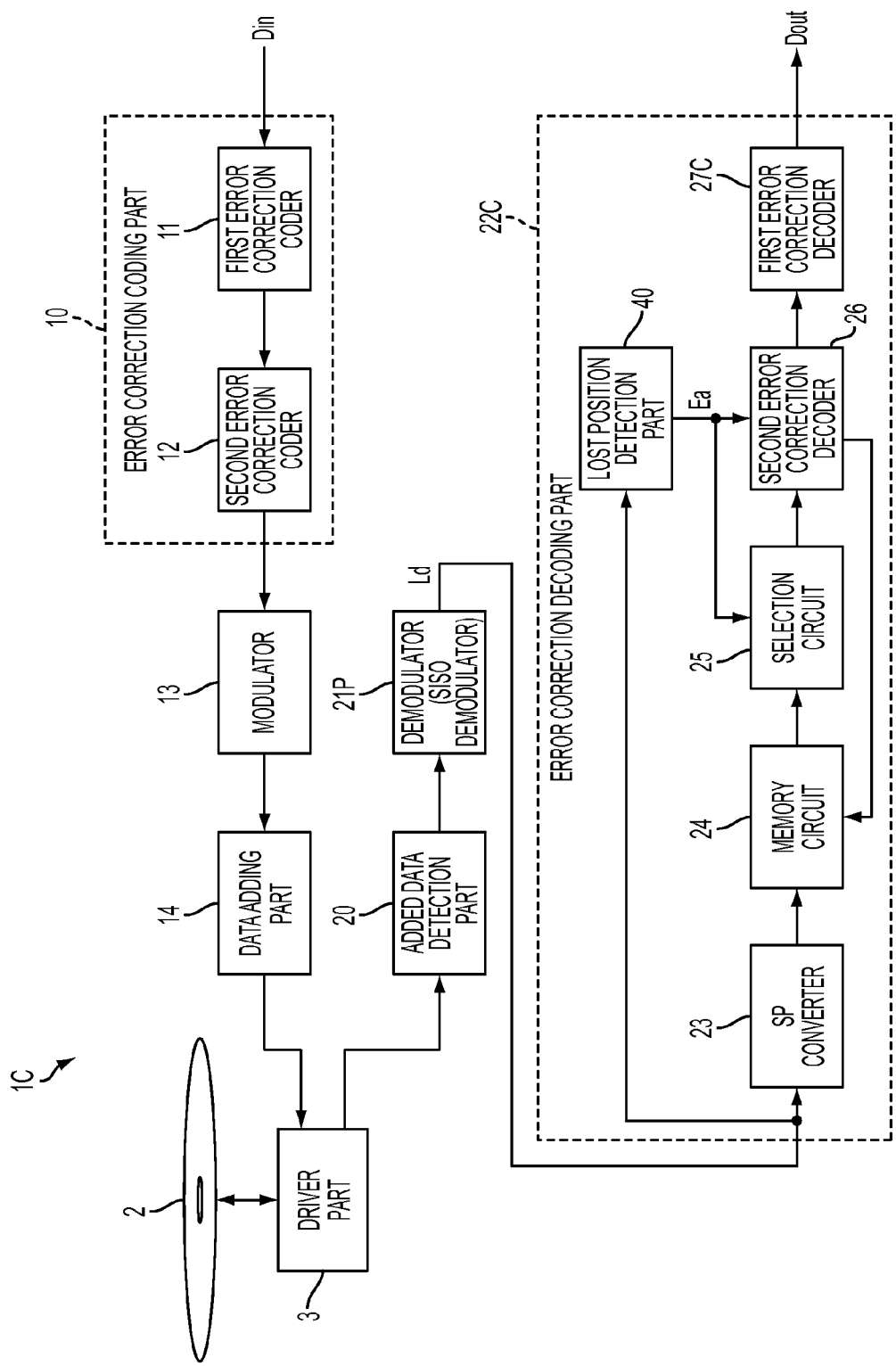
FIG. 15 is a functional block diagram showing a schematic configuration of a recording/reproduction device as the third embodiment of the present invention.

The third embodiment of the present invention is now explained. FIG. 15 is a functional block diagram showing the schematic configuration of a recording/reproduction device 1C as the third embodiment. The recording/reproduction device 1C is configured the same as the recording/reproduction device 1A (FIG. 1) of the first embodiment excluding the SISO demodulator 21P and the error correction decoding part 22C. Whereas the SISO demodulator 21 of the first embodiment outputs the likelihood information Ld as parallel data, the SISO demodulator 21P of the third embodiment outputs the likelihood information Ld as serial data.

The error correction decoding part 22C includes an SP converter (serial-parallel converter) 23, a memory circuit 24, a selection circuit 25, a second error correction decoder 26, a first error correction decoder 27C, and a lost position detection part 40. The configuration of the memory circuit 24, the selection circuit 25 and the second error correction decoder 26 shown in FIG. 15 is the same as the configuration of the memory circuit 24, the selection circuit 25 and the second error correction decoder 26 of the error correction decoding part 22A in the first embodiment. The first error correction decoder 27C has the same decoding function as the first error correction decoder 27 (FIG. 1) of the first embodiment excluding the point that it does not have the function of creating erasure flags Er.

The lost position detection part 40 detects a lost bit in the series of the likelihood information Ld and creates an erasure flag Ea indicating the position of the detected lost bit. The selection circuit 25 supplies the log likelihood ratio that does not correspond to the position of the lost bit in the data series read from the memory circuit 24 to the second error correction decoder 26 as is in accordance with the erasure flag Ea, and supplies a predetermined value that invalidates the log likelihood ratio to the second error correction decoder 26 in substitute for the log likelihood ratio that corresponds to the position of the lost bit.

Figure 16:
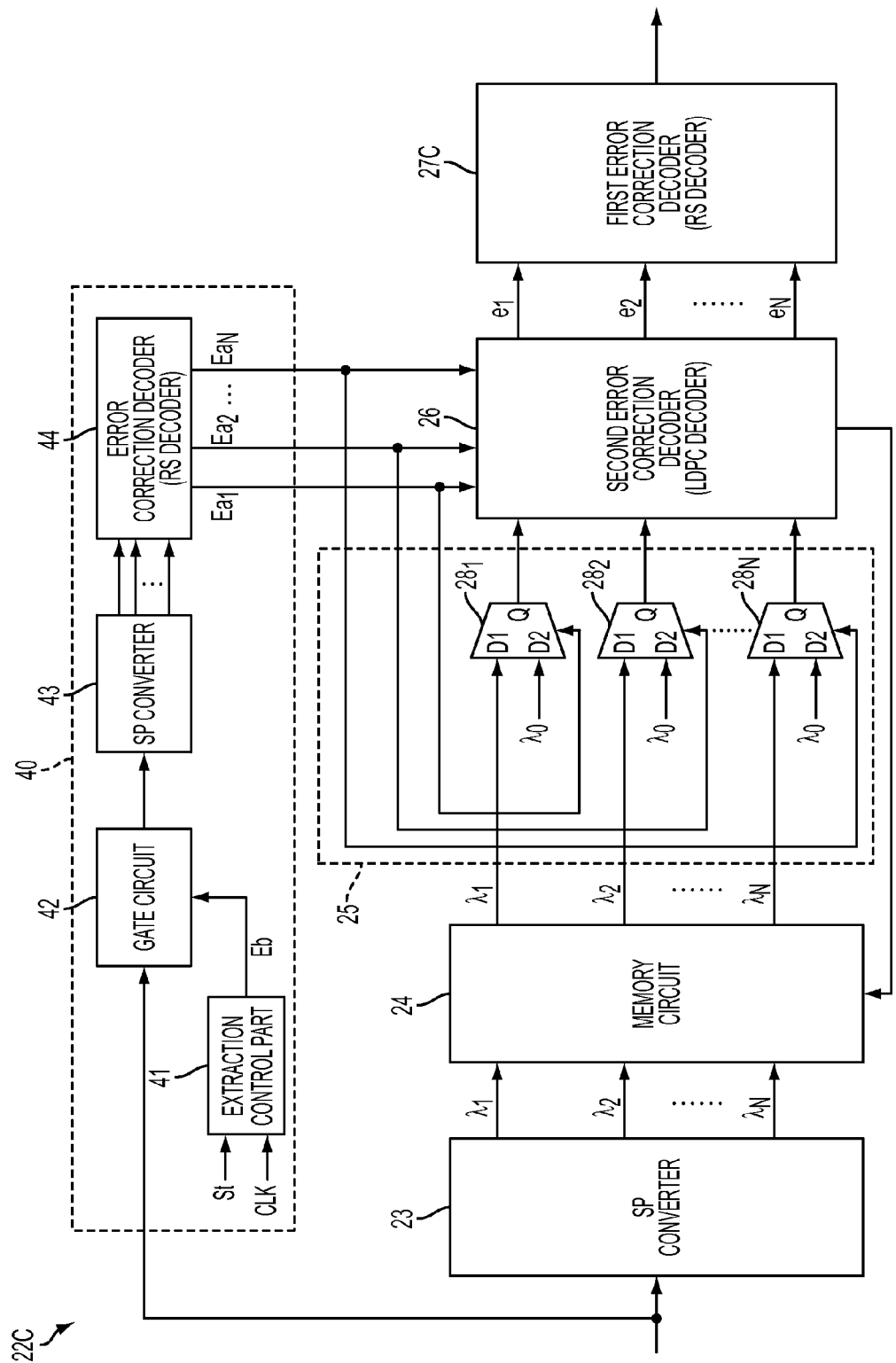
FIG. 16 is a block diagram showing a configuration of an error correction decoding part according to the third embodiment.

FIG. 16 is a diagram showing an example of the configuration of the error correction decoding part 22C of the third embodiment. Serial data of the likelihood information Ld is supplied from the SISO demodulator 21P to the SP converter 23. As shown in FIG. 16, the SP converter 23 converts the serial data of the likelihood information Ld into parallel data indicating the N log likelihood ratios $\lambda_1$ to $\lambda_N$ in code word units, and supplies this to the memory circuit 24. The selection circuit 25 is configured the same as the selection circuit 25 shown in FIG. 4. However, the selection circuit 25 selects either the log likelihood ratio $\lambda_k$ or the predetermined value $\lambda_0$ that invalidates the log likelihood ratio $\lambda_k$ according to the value ("0" or "1") of the erasure flag Eak supplied from the lost position detection part 40, and supplies the selected value to the second error correction decoder 26. Incidentally, if the predetermined value $\lambda_0$ is set to "0," the N logic circuits $29_1$ to $29_N$ shown in FIG. 5 may be used in substitute for the configuration of the selection circuit 25 shown in FIG. 16.

As shown in FIG. 16, the lost position detection part 40 includes an extraction control part 41, a gate circuit 42, an SP converter (serial-parallel converter) 43, and an error correction decoder (RS decoder) 44. The extraction control part 41 and the gate circuit 42 have a code extraction function of extracting the MSB (most significant bit) of likelihood information of the user data area and the data area corresponding to the outer code among the series of the likelihood information Ld supplied from the SISO demodulator 21P. When the extraction control part 41 receives a reset pulse St from the controller (not shown), it creates an extraction control signal Eb designating the user data area and the data area corresponding to the outer code while synchronizing with a clock CLK. The gate circuit 42 extracts the MSB of likelihood information of the data area according to the extraction control signal Eb. The SP converter 43 converts the serial data configured from the extracted MSB of likelihood information into parallel data in code word units, and supplies this to the error correction decoder 44.

Figure 17:
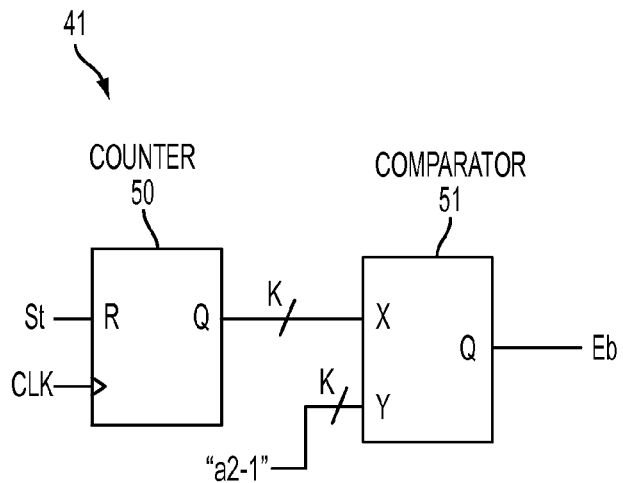
FIG. 17 is a circuit diagram showing an example of a configuration of an extraction control part according to the third embodiment.
Figure 18:
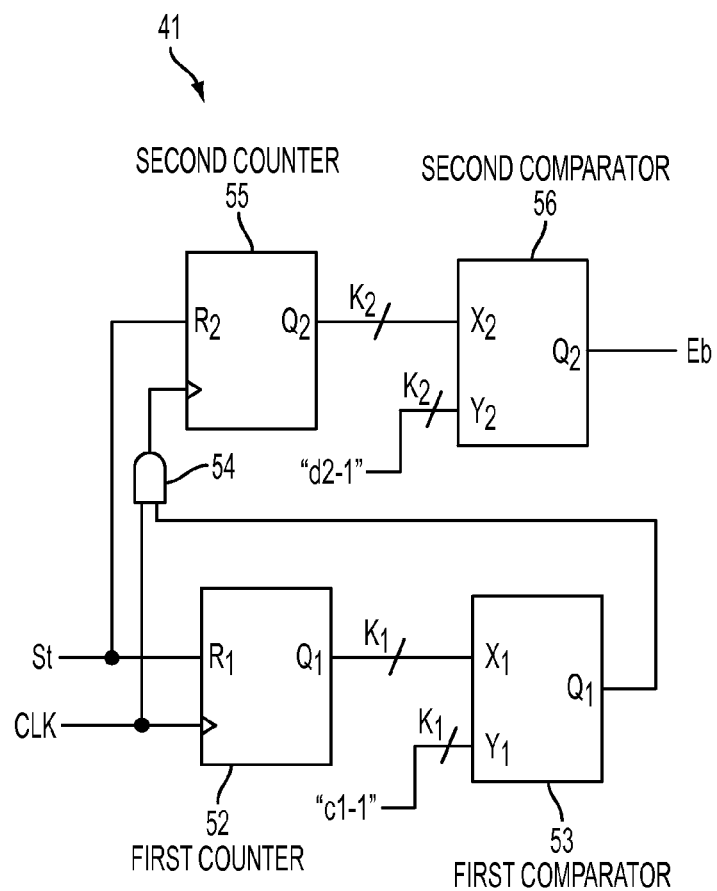
FIG. 18 is a circuit diagram showing another example of a configuration of an extraction control part according to the third embodiment.
Figure 19:
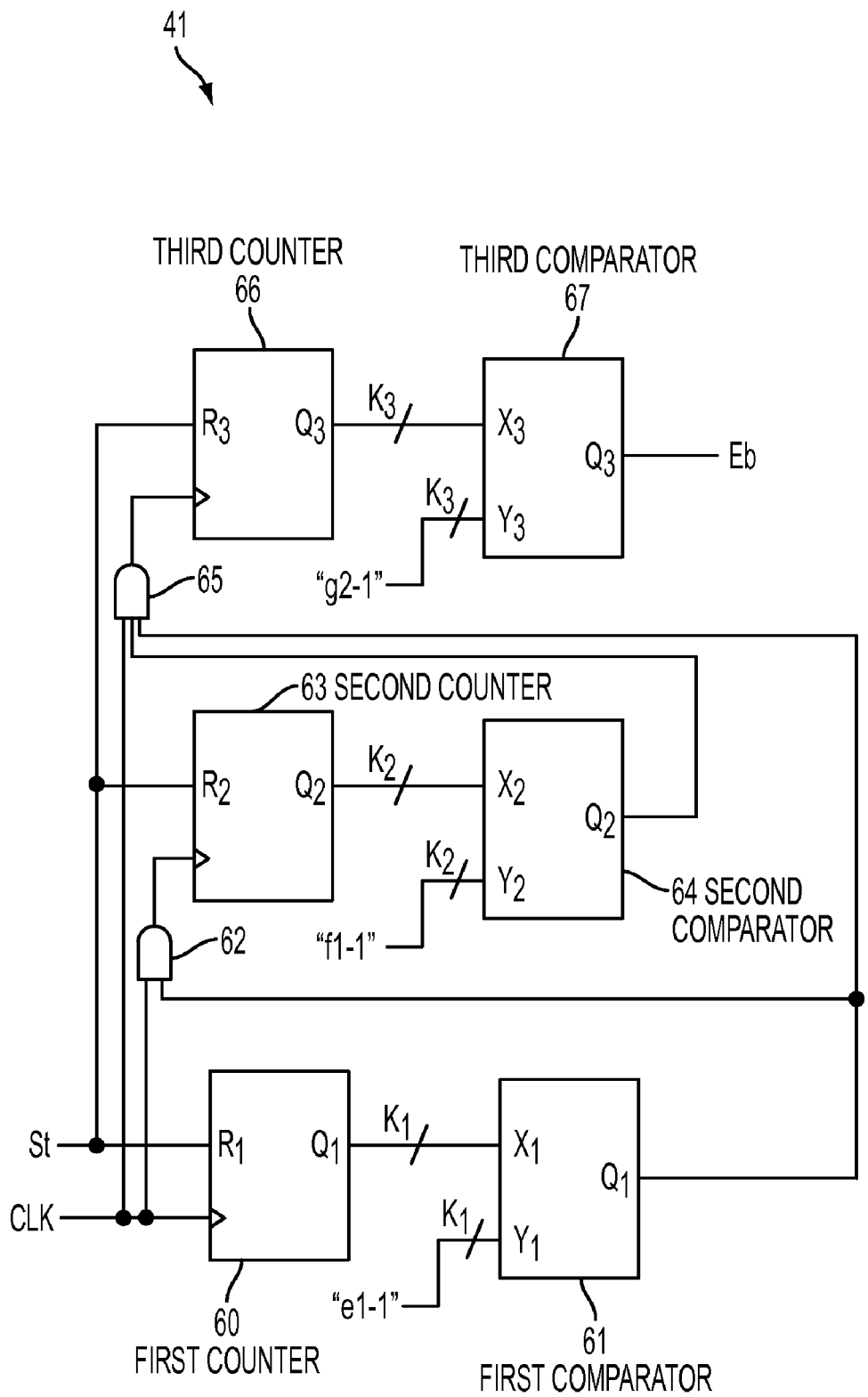
FIG. 19 is a circuit diagram showing yet another example of a configuration of an extraction control part according to the third embodiment.

FIG. 17 to FIG. 19 are diagrams showing a part of the circuit configuration of the extraction control part 41. FIG. 17 shows the circuit configuration for extracting the data block and the outer code block having the error correction code format of FIG. 2A, FIG. 18 shows the circuit configuration for extracting the data block and the outer code block having the error correction code format of FIG. 2B, and FIG. 19 shows the circuit configuration for extracting the data block and the outer code block from the code block having the error correction code format of FIG. 3.

With the circuit shown in FIG. 17, a counter 50 resets the discrete value of the K bit to the initial value (="0") according to the reset pulse St and starts the pulse count operation of the clock CLK, and thereafter creates a discrete value within the range of "0" to "a1−1." The comparator 51 supplies the 1 bit extraction control signal Eb having the value of "1" to the gate circuit 42 if the discrete value output from the counter 50 is within the range ("0" to "a2−1") corresponding to the length in the columnwise direction of the data block and the outer code block of FIG. 2A. Here, the gate circuit 42 transfers the likelihood information to the SP converter 43. Meanwhile, when the discrete value exceeds the range ("0" to "a2−1") corresponding to the code length of the data block and the outer code block of FIG. 2A, [the comparator 51] supplies a 1 bit extraction control signal Eb having a value of "0" to the gate circuit 42. Here, the gate circuit 42 blocks the likelihood information.

With the circuit shown in FIG. 18, the first counter 52 resets the discrete value of the $K_1$ bit to the initial value (="0") according to the reset pulse St and starts the pulse count operation of the clock CLK, and thereafter creates a discrete value within the range of "0" to "c1−1." The first comparator 53 supplies a 1 bit output having a value of "1" to the AND gate 54 when the discrete value output from the first counter 52 coincides with the value (="c1−1") corresponding to the length in the columnwise direction of the code block of FIG. 2B. If the discrete value does not coincide with the "c1−1," the first comparator 53 supplies a 1 bit output having a value of "0" to the AND gate 54. The AND gate 54 supplies the clock CLK to the second counter 55 only when the output value of the first comparator 53 is "1." Meanwhile, if the output value of the first comparator 53 is "0," the output value of the AND gate 54 is fixed to "0." Here, the count operation of the second counter 55 is stopped to inhibit power consumption. The clock that is supplied from the AND gate 54 to the second counter 55 as described above is referred to as a gated clock. The first counter 52, the first comparator 53 and the AND gate 54 are a circuit group designating the columnwise direction range of the data area of the data block and the outer code block of FIG. 2B.

Moreover, the second counter 55 resets the discrete value of the $K_2$ bit to the initial value (="0") according to the reset pulse St and starts the pulse count operation of the gated clock, and thereafter creates a discrete value within the range of "0" to "d1−1." The second comparator 56 supplies a 1 bit extraction control signal Eb having a value of "1" if the discrete value output from the second counter 55 is within the range ("0" to "d2−1") corresponding to the length in the line writing direction of the data block and the outer code block of FIG. 2B. If the discrete value exceeds the range ("0" to "d2−1") of FIG. 2B, the second comparator 56 supplies a 1 bit extraction control signal Eb having a value of "0."

Subsequently, with the circuit shown in FIG. 19, the first counter 60 resets the discrete value of the $K_1$ bit to the initial value (="0") according to the reset pulse St and starts the pulse count operation of the clock CLK, and thereafter creates a discrete value within the range of "0" to "e1−1." The first comparator 61 supplies a 1 bit output having a value of "1" to the first AND gate 62 and the second AND gate 65 if the discrete value output from the first counter 60 coincides with the value (="e1−1") corresponding to the length in the columnwise direction of each code block of FIG. 3. If the discrete value does not coincide with "e1−1," the first comparator 61 supplies a 1 bit output having a value of "0" to the first AND gate 62 and the second AND gate 65. The first AND gate 62 outputs the gated clock through the clock CLK only when the output value of the first comparator 61 is "1." Meanwhile, if the output value of the first comparator 61 is "0," the output value of the first AND gate 62 and the second AND gate 65 is fixed to "0," and the count operation of the second counter 63 and the third counter 66 is stopped. The first counter 60, the first comparator 61, the first AND gate 62 and the second AND gate 65 are a circuit group designating the columnwise direction range of the data area of the data block and the outer code block in each code block of FIG. 3.

In addition, the second counter 63 resets the discrete value of the $K_2$ bit to the initial value (="0") according to the reset pulse St and starts the pulse count operation of the gated clock supplied from the first AND gate 62, and thereafter creates a discrete value within the range of "0" to "f1−1." The second comparator 64 supplies a 1 bit output having a value of "1" to the second AND gate 65 if the discrete value output from the second counter 63 coincides with the value "f1−1" corresponding to the length in the line writing direction of each code block of FIG. 3. If the discrete value does not coincide with "f1−1," the second comparator 64 supplies a 1 bit output having a value of "0" to the second AND gate 65. The second AND gate 65 supplies the gated clock to the third counter 66 only when the output value of the first comparator 61 is "1" and the output value of the second comparator 64 is "1." However, if the output value of the second comparator 64 is "0," the count operation of the third counter 66 is stopped since the output value of the AND gate 65 is fixed to "0." The second counter 63, the second comparator 64 and the second AND gate 65 are a circuit group designating the line writing direction range of the data area of the data block and the outer code block of FIG. 3.

Moreover, the third counter 66 resets the discrete value of the $K_3$ bit to the initial value (="0") according to the reset pulse St and starts the pulse count operation of the gated clock supplied from the second AND gate 65, and thereafter creates a discrete value [within the range] of "0" to "g1−1." The third comparator 67 supplies a 1 bit extraction control signal Eb having a value of "1" if the discrete value output from the third counter 66 is within the range ("0" to "g2−1") excluding the inner code block of FIG. 3. If the discrete value exceeds the foregoing range ("0" to "g2−1"), the third comparator 67 supplies a 1 bit extraction control signal Eb having a value of "0."

The error correction decoder 44 shown in FIG. 16 has a function of detecting a lost bit (erasure) in symbol units by performing algebraic error correction decoding to an MSB series of log likelihood ratios $\lambda_1$ to $\lambda_N$ supplied in parallel from the SP converter 43. If a lost bit is detected, the error correction decoder 44 creates an erasure flag Ea indicating the position of the lost bit, and supplies this to the selection circuit 25 and the second error correction decoder 26.

Figure 20:
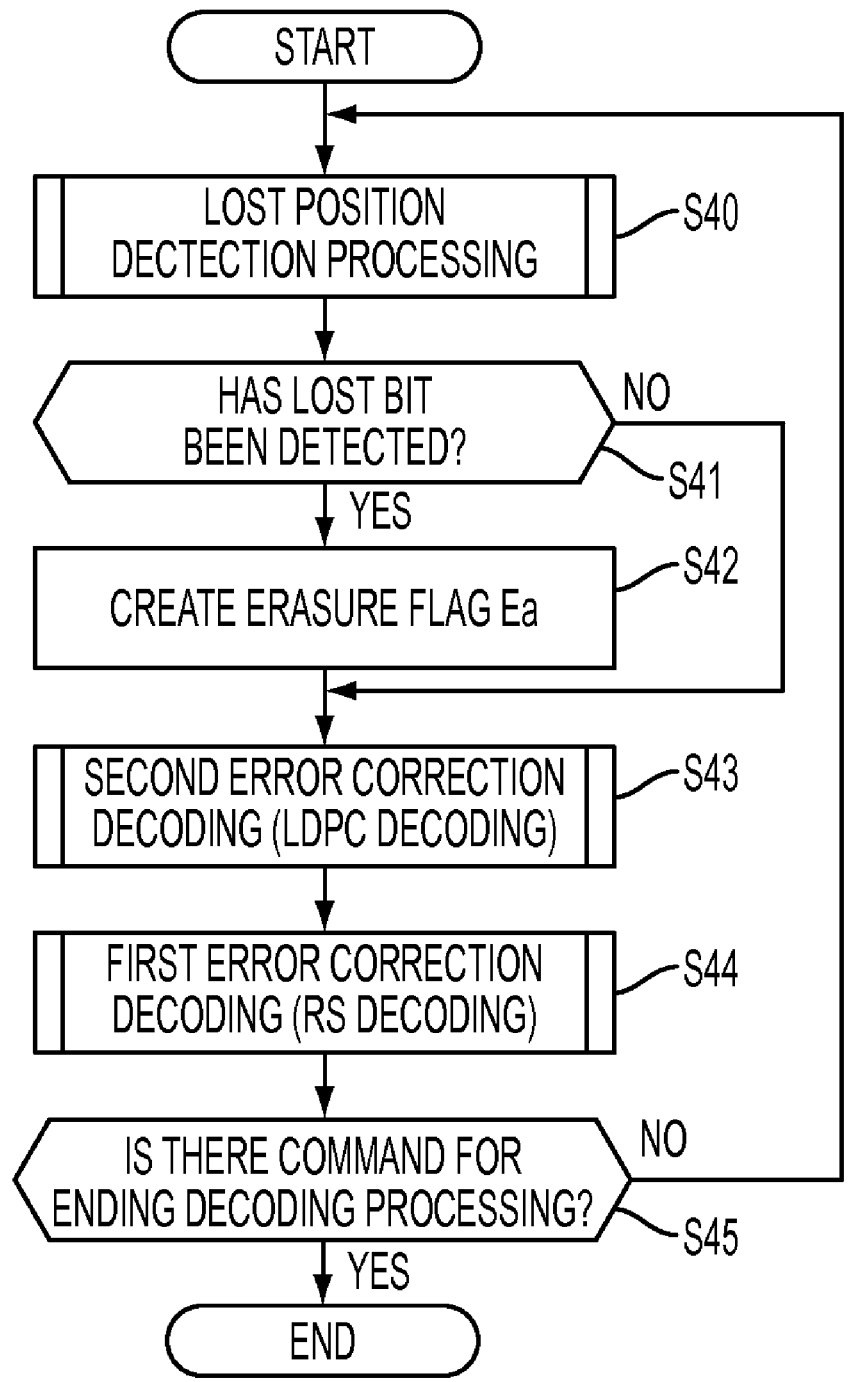
FIG. 20 is a flowchart schematically showing an operation routine of an error correction decoding part according to the third embodiment.

The processing routine to be performed by the foregoing error correction decoding part 22C is explained with reference to FIG. 20. FIG. 20 is a flowchart schematically explaining a part of the processing routine to be performed by the error correction decoding part 22C.

As described above, the lost position detection part 40 executes the lost position detection processing by performing algebraic error correction decoding to an MSB series of log likelihood ratios $\lambda_1$ to $\lambda_N$ of a user data area and a data area (area including the data block and the outer code block) corresponding to the outer code (step S40). Here, if a lost bit is detected (step S41), the lost position detection part 40 creates erasure flags $Ea_1$ to $Ea_N$ and supplies the erasure flags $Ea_1$ to $Ea_N$ to the selection circuit 25 and the second error correction decoder 26 (step S42). The selection circuit 25 supplies the log likelihood ratio $\lambda_k$ read from the memory circuit 24 to the second error correction decoder 26 if the value of the erasure flag Eak is "0," and supplies a predetermined value $\lambda 0$ to the second error correction decoder 26 in substitute for the log likelihood ratio $\lambda_k$ if the value of the erasure flag Eak is "1." Meanwhile, if a lost bit is not detected (step S41), the routine of step S42 is skipped.

Subsequently, the second error correction decoder 26 executes the same processing as the LDPC decoding (steps S20 to S33) shown in FIG. 7 and supplies a series of deduced words $e_1$ to eN to the first error correction decoder 27C (step S43). The first error correction decoder 27C performs algebraic error correction decoding to the series of the deduced words $e_1$ to $e_N$ and outputs the decoding result as output data Dout (step S44). In addition, if a controller (not shown) does not issue a command for ending the decoding processing (step S45), the processing is returned to step S40. Meanwhile, if a command for ending the decoding processing is issued (step S45), the foregoing decoding processing is ended.

As described above, in the third embodiment, the lost position detection part 40 detects the position of a lost bit by executing algebraic decoding of the outer code before the second error correction decoder 26 executes the LDPC decoding of the inner code. The second error correction decoder 26 is able to execute repetitive decoding using the erasure flags $Ea_1$ to $Ea_N$ indicating the accurate position of the lost bit without having to use unreliable likelihood information Ld. Accordingly, it is possible to realize error correction decoding with high throughput and high precision.

Incidentally, in the foregoing third embodiment, the error correction decoding part 22C includes an SP converter 23, and the lost position detection part 40 includes an SP converter 43 as shown in FIG. 16. However, the SP converters 23, 43 are not necessarily essential constituent elements. If the error correction decoding part 22C does not include an SP converter 23, the memory circuit 24 simply needs to have a configuration capable of storing serial data and outputting parallel data. Moreover, if the lost position detection part 40 does not include an SP converter 43, the error correction decoder 44 simply needs to have a configuration capable of processing the serial output of the gate circuit 42.

Fourth Embodiment

Figure 21:
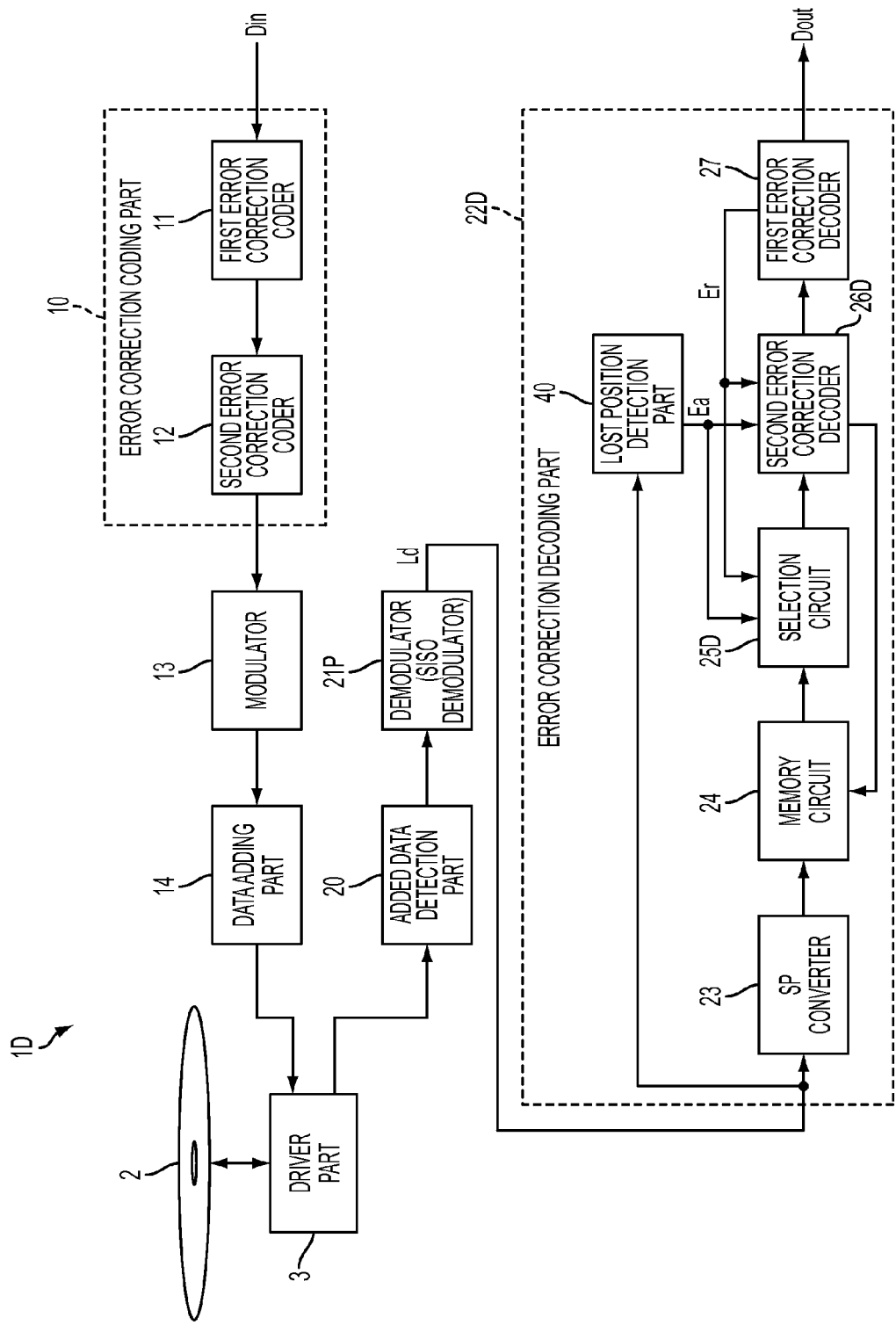
FIG. 21 is a functional block diagram showing a schematic configuration of a recording/reproduction device as the fourth embodiment of the present invention.

The fourth embodiment of the present invention is now explained. FIG. 21 is a functional block diagram showing the schematic configuration of a recording/reproduction device 1D as the fourth embodiment. The recording/reproduction device 1D has both the function of the recording/reproduction device 1A (FIG. 1) of the first embodiment and the function of the recording/reproduction device 1C (FIG. 15) of the third embodiment. The recording/reproduction device 1D is configured the same as the recording/reproduction device 1A (FIG. 1) of the first embodiment excluding the SISO demodulator 21P and the error correction decoding part 22D. While the SISO demodulator 21 of the first embodiment outputs the likelihood information Ld as parallel data, the SISO demodulator 21P of the fourth embodiment outputs the likelihood information Ld as serial data.

The error correction decoding part 22D includes an SP converter 23, a memory circuit 24, a selection circuit 25D, a second error correction decoder 26D, a first error correction decoder 27, and a lost position detection part 40. The configuration of the memory circuit 24 and the first error correction decoder 27 of FIG. 21 is the same as the configuration of the memory circuit 24 and the first error correction decoder 27 of the error correction decoding part 22A of the first embodiment. Moreover, the configuration of the lost position detection part 40 and the SP converter 23 of FIG. 21 is the same as the configuration of the lost position detection part 40 and the SP converter 23 (FIG. 15) of the third embodiment.

The second error correction decoder 26D has the same decoding function as the second error correction decoder 26 of the error correction decoding part 22A in the first embodiment, and is also able to re-read a data series of log likelihood ratios from the memory circuit 24 according to the erasure flag Ea from the lost position detection part 40 or the erasure flag Er from the first error correction decoder 27. The selection circuit 25D supplies the log likelihood ratio that does not correspond to the position of the lost bit in the data series read from the memory circuit 24 to the second error correction decoder 26D as is in accordance with the erasure flag Er or Ea, and supplies a predetermined value that invalidates the log likelihood ratio to the second error correction decoder 26D in substitute for the log likelihood ratio that corresponds to the position of the lost bit.

Figure 22:
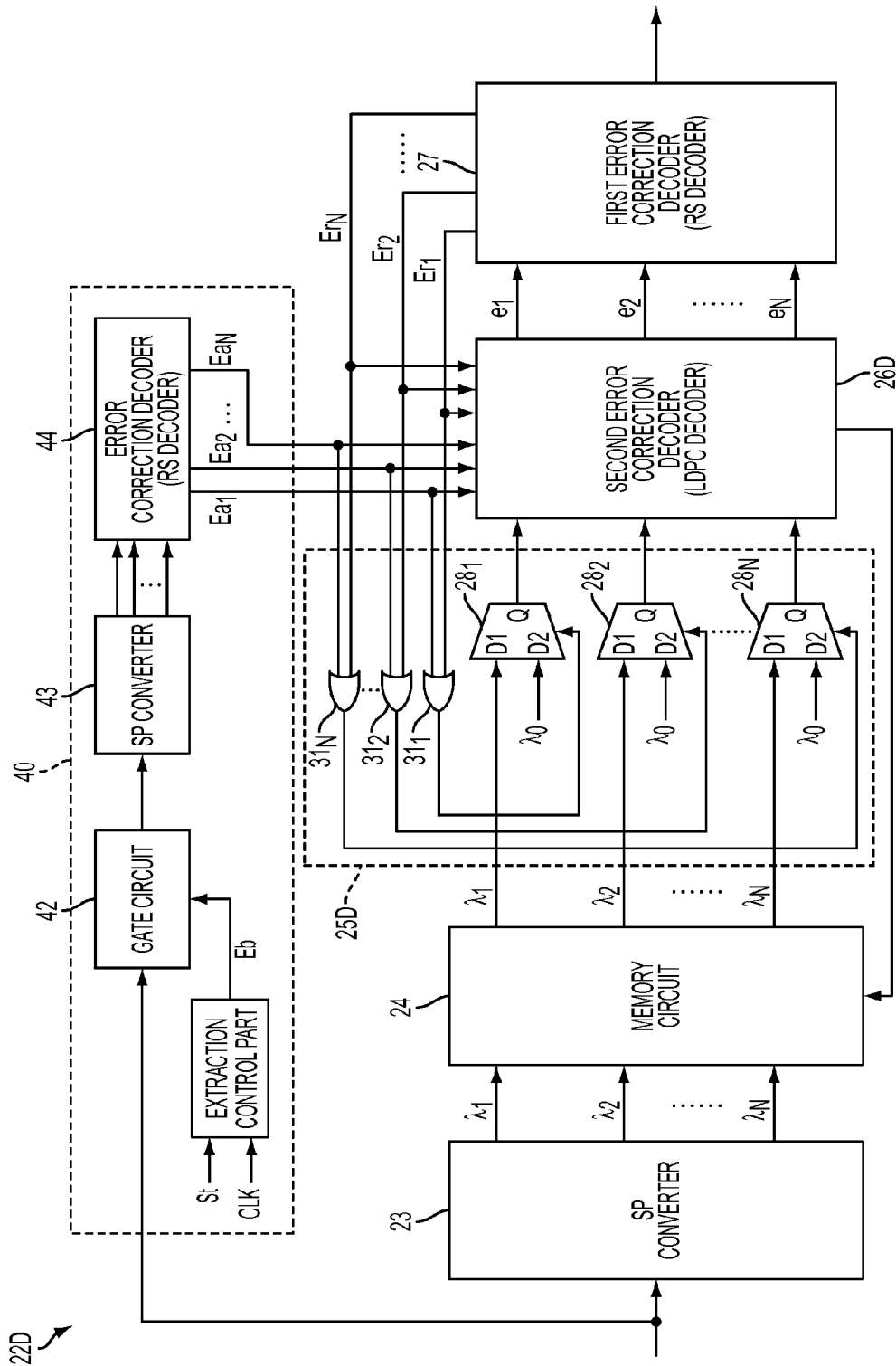
FIG. 22 is a block diagram showing a configuration of an error correction decoding part according to the fourth embodiment.

FIG. 22 is a diagram showing an example of the configuration of the error correction decoding part 22D. Serial data of the likelihood information Ld is supplied from the SISO demodulator 21P to the SP converter 23. As shown in FIG. 22, the SP converter 23 converts the serial data of the likelihood information Ld into parallel data indicating the N log likelihood ratios $\lambda_1$ to $\lambda_N$ in code word units, and supplies this to the memory circuit 24. The selection circuit 25D is configured the same as the selector groups $28_1$ to 28N shown in FIG. 4, and additionally includes an OR gate $31_k$ for performing OR operation to the bits of the erasure flags Eak, Erk (k is an arbitrary integer from 1 to N). Output of the OR gates $31_1$ to $31_N$ is supplied to the controlled terminal of the selectors $28_1$ to 28N, respectively.

Figure 23:
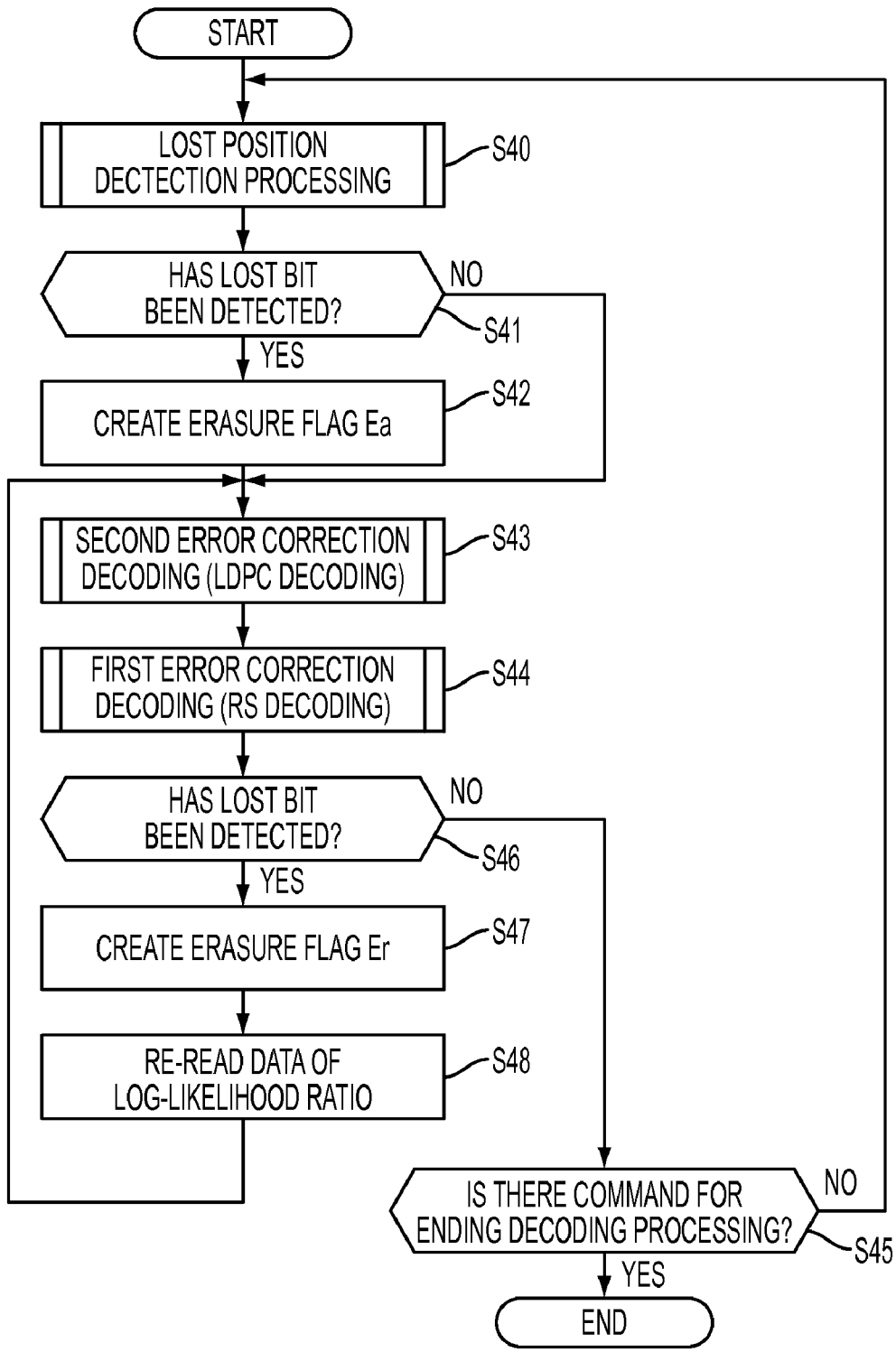
FIG. 23 is a flowchart schematically showing an operation routine of an error correction decoding part according to the fourth embodiment.

The processing routine to be performed by the foregoing error correction decoding part 22D is now explained with reference to FIG. 23. FIG. 23 is a flowchart schematically showing a part of the processing routine to be performed by the error correction decoding part 22D.

As described above, the lost position detection part 40 executes the lost position detection processing by performing algebraic error correction decoding to an MSB series of log likelihood ratios $\lambda_1$ to $\lambda_N$ of a user data area and a data area (area including the data block and the outer code block) corresponding to the outer code (step S40). Here, if a lost bit is detected (step S41), the lost position detection part 40 creates erasure flags $Ea_1$ to $Ea_N$ and supplies the erasure flags $Ea_1$ to $Ea_N$ to the selection circuit 25D and the second error correction decoder 26D (step S42). The selection circuit 25 supplies the log likelihood ratio $\lambda_k$ read from the memory circuit 24 to the second error correction decoder 26 if the value of the erasure flag Eak is "0," and supplies a predetermined value $\lambda 0$ to the second error correction decoder 26 in substitute for the log likelihood ratio $\lambda_k$ if the value of the erasure flag Eak is "1." Meanwhile, if a lost bit is not detected (step S41), the routine of step S42 is skipped.

Subsequently, the second error correction decoder 26D executes the same processing as the LDPC decoding (steps S20 to S33) shown in FIG. 7 and supplies a series of deduced words $e_1$ to eN to the first error correction decoder 27 (step S43). The first error correction decoder 27 performs algebraic error correction decoding to the series of the deduced words $e_1$ to $e_N$ and outputs the decoding result as output data Dout (step S44). Here, if a lost bit is detected (step S46), the first error correction decoder 27 creates erasure flags $Er_1$ to $Er_N$ and supplies the erasure flags $Er_1$ to $Er_N$ to the selection circuit 25D and the second error correction decoder 26D (step S47).

After the creation of the erasure flags $Er_1$ to $Er_N$ (step S47), the second error correction decoder 26D re-reads the log likelihood ratios $\lambda_1$ to $\lambda_N$ corresponding to the lost bit from the memory circuit 24 in code word units (step S48). Data of the re-read log likelihood ratios $\lambda_1$ to $\lambda_N$ is supplied to the selection circuit 25D. Here, the selection circuit 25D supplies the log likelihood ratio $\lambda_k$ to the second error correction decoder 26D if the value of the erasure flag Erk is "0," and supplies a predetermined value $\lambda 0$ to the second error correction decoder 26D in substitute for the log likelihood ratio $\lambda_k$ if the value of the erasure flag Erk is "1." Then, the second error correction decoder 26 returns to the processing of step S43 and executes LDPC decoding. The routine of steps S43 to S48 is thereafter repeatedly executed until it is determined that a lost bit is not detected at step S46.

If the first error correction decoder 27 does not detect a lost bit in the series of the deduced words $e_1$ to eN at step S46, and a controller (not shown) does not issue a command to end the decoding processing (step S45), the processing returns to step S40 and the decoding processing continues. Meanwhile, if a command for ending the decoding processing is issued (step S45), the foregoing decoding processing is ended.

Incidentally, in the foregoing fourth embodiment, the error correction decoding part 22D includes an SP converter 23, and the lost position detection part 40 includes an SP converter 43 as shown in FIG. 22. However, the SP converters 23, 43 are not necessarily essential constituent elements. If the error correction decoding part 22D does not include an SP converter 23, the memory circuit 24 simply needs to have a configuration capable of storing serial data and outputting parallel data. Moreover, if the lost position detection part 40 does not include an SP converter 43, the error correction decoder 44 simply needs to have a configuration capable of processing the serial output of the gate circuit 42.

Fifth Embodiment

Figure 24:
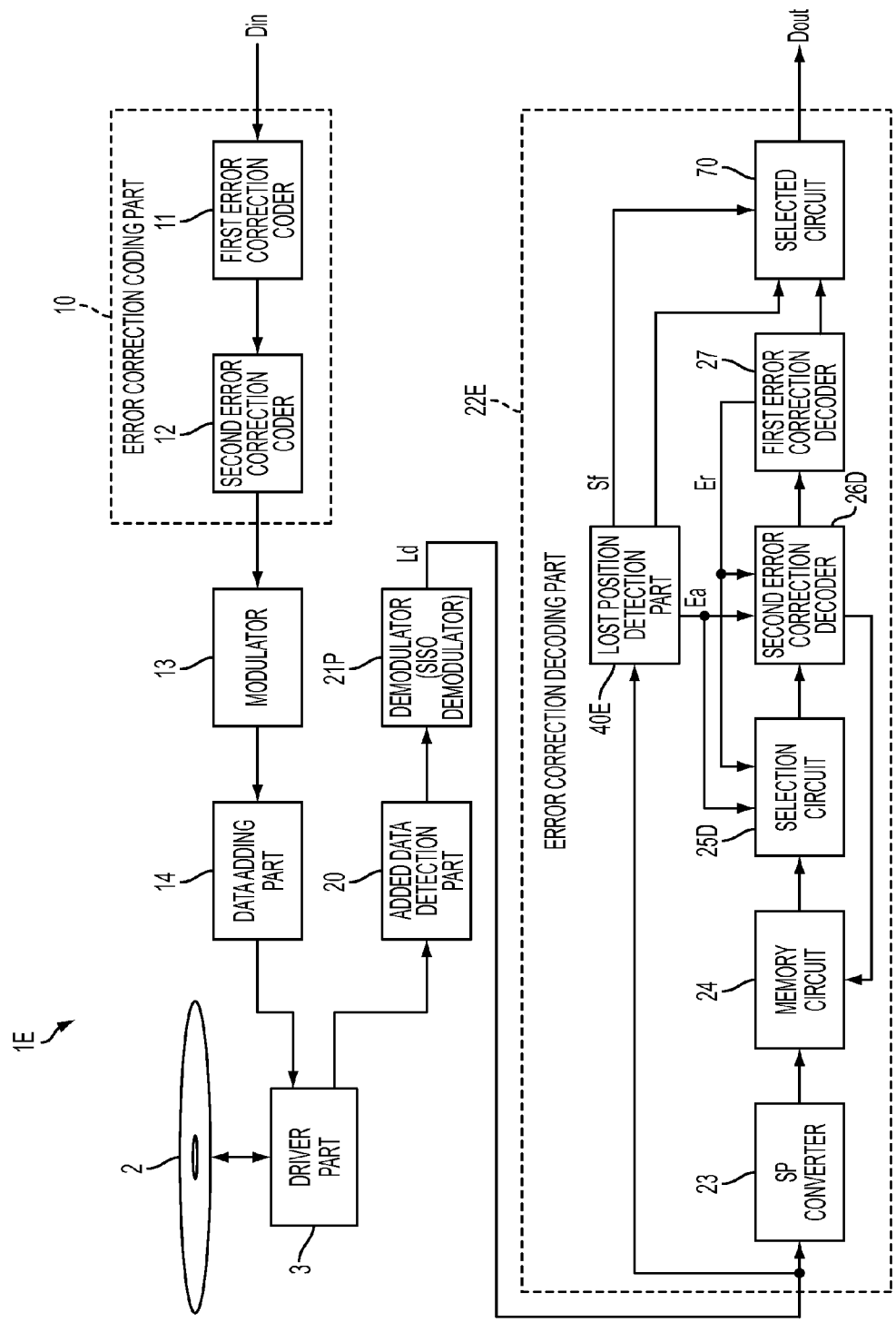
FIG. 24 is a functional block diagram showing a schematic configuration of a recording/reproduction device as the fifth embodiment of the present invention.

The fifth embodiment of the present invention is now explained. FIG. 24 is a functional block diagram showing the schematic configuration of a recording/reproduction device 1E as the fifth embodiment. The recording/reproduction device 1E has the same functions as the recording/reproduction device 1D (FIG. 21) of the fourth embodiment excluding the error correction decoding part 22E. The error correction decoding part 22E has the same configuration as the SP converter 23, the memory circuit 24, the selection circuit 25D, the second error correction decoder 26D and the first error correction decoder 27 of the error correction decoding part 22D (FIG. 21 and FIG. 22) in the fourth embodiment, and additionally includes a selection circuit 70 and a lost position detection part 40E.

Figure 25:
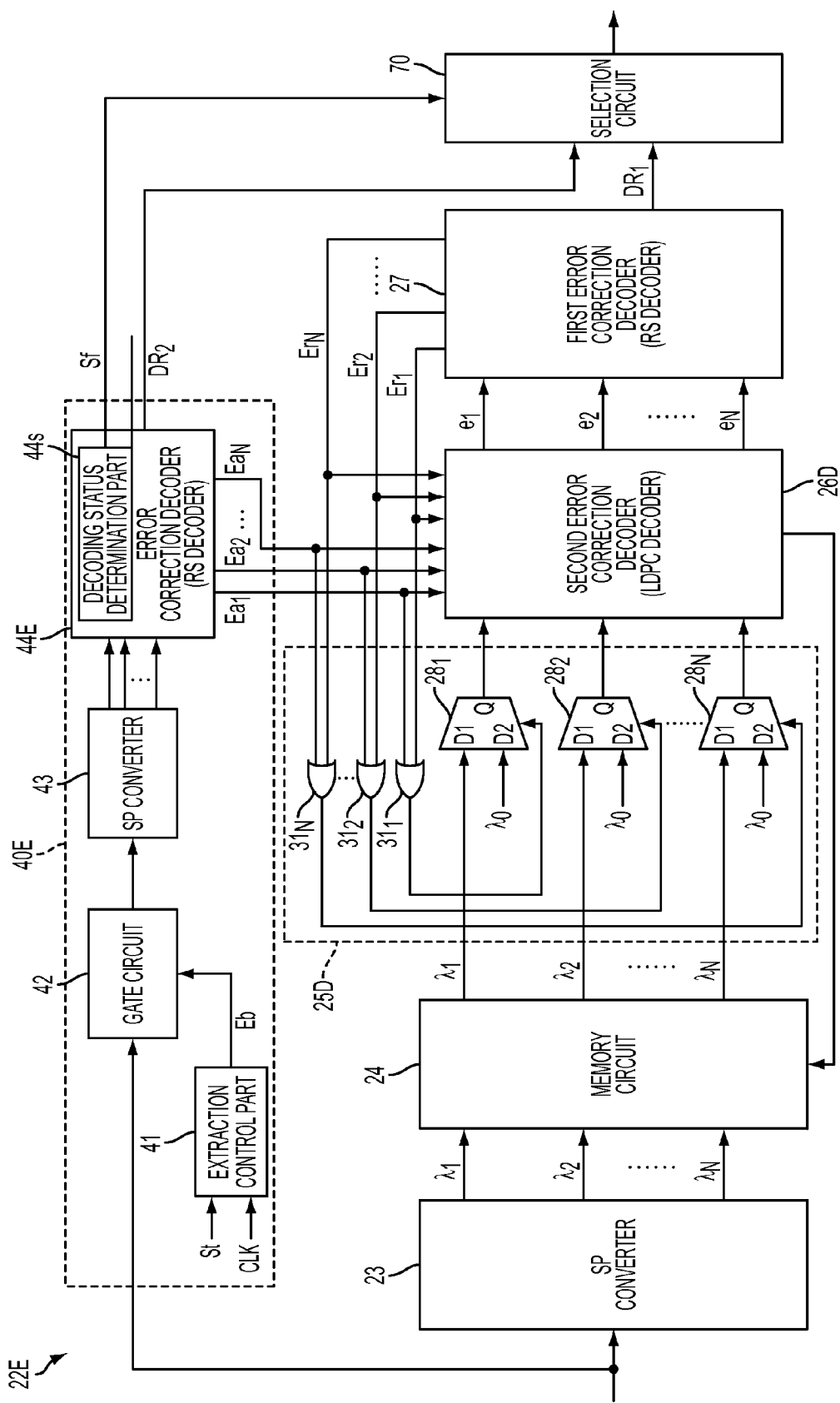
FIG. 25 is a block diagram showing a configuration of an error correction decoding part according to the fifth embodiment.

FIG. 25 is a diagram showing an example of the configuration of the error correction decoding part 22E of the fifth embodiment. As shown in FIG. 25, the lost position detection part 40E includes the same extraction control part 41, gate circuit 42 and SP converter 43 as the lost position detection part 40 of the foregoing fourth embodiment. The lost position detection part 40E includes an error correction decoder 44E comprising a decoding status determination part 44s, and the error correction decoder 44E has, in addition to the function of detecting a lost bit by executing algebraic decoding, a function of outputting the decoding result $DR_2$ of such algebraic decoding.

As described above, the error correction decoder 44E has a function of detecting a lost bit (erasure) in symbol parts by performing algebraic error correction decoding to an MSB series of log likelihood ratios $\lambda_1$ to $\lambda_N$ extracted from the gate circuit 42. The decoding status determination part 44s is able to determine four types of decoding states; namely, 1) state with no symbol error, 2) state in which the number of symbol errors is within a correctable symbol count, 3) state in which the number of symbol errors is within a symbol count where the error position can be detected, and 4) state in which the number of symbol errors exceeds a symbol count where the error position can be detected. The decoding status determination part 44s determines that the possibility of foregoing state 1) or state 2) is high if the SNR (signal-to-noise ratio) is high. In addition, in the case of foregoing state 4), it would be appropriate to perform processing as being non-reproducible.

Based on the foregoing perspective, if the decoding status determination part 44s determines that the decoding state is foregoing state 1) and state 2), it creates a switch control signal Sf for causing the selection circuit 70 to select the decoding output $DR_2$ of the error correction decoder 44E. In addition, if the decoding status determination part 44s determines that the decoding state is foregoing state 4), it creates a switch control signal Sf for causing the selection circuit 70 to select the decoding output $DR_1$ of the first error correction decoder 27.

Moreover, if the decoding status determination part 44s determines that the decoding state is foregoing state 3), it determines that the [decoding state] is of an error correction disabled state in which a lost bit was detected, and creates erasure flags $Ea_1$ to $Ea_N$. Simultaneously, the decoding status determination part 44s creates a switch control signal Sf for causing the selection circuit 70 to select the decoding output $DR_1$ of the first error correction decoder 27.

As described above, in the fifth embodiment, since the optimal decoding processing can be executed according to the decoding state detected with the lost position detection part 40, it is possible to improve the error correction performance and throughput.

Incidentally, in the foregoing fifth embodiment, the error correction decoding part 22E includes an SP converter 23, and the lost position detection part 40E includes an SP converter 43 as shown in FIG. 25. However, the SP converters 23, 43 are not necessarily essential constituent elements. If the error correction decoding part 22E does not include an SP converter 23, the memory circuit 24 simply needs to have a configuration capable of storing serial data and outputting parallel data. Moreover, if the lost position detection part 40[E] does not include an SP converter 43, the error correction decoder 44 simply needs to have a configuration capable of processing the serial output of the gate circuit 42.

The invention claimed is:

1. A decoding device for performing error correction decoding of encoded data formed from a combination of an outer code for first error correction and an inner code for second error correction, the device comprising:
a demodulator for demodulating the encoded data and creating a data series of likelihood information values;
a memory circuit for temporarily storing the data series of likelihood information values;
a second error correction decoder for creating a hard decision value series by executing repetitive decoding for the second error correction based on the data series of likelihood information values read from the memory circuit; and
a first error correction decoder for detecting a lost bit in the hard decision value series by executing algebraic decoding for the first error correction to the hard decision value series and creating an erasure flag indicating a position of the detected lost bit, wherein
the second error correction decoder creates a series of temporary deduced words or deduced words by executing hard decision based on the data series of likelihood information values read for the first time from the memory circuit, and wherein
the first error correction decoder detects a lost bit in the series of temporary deduced words or deduced words by executing the algebraic decoding to the created series of temporary deduced words or deduced words and creates an erasure flag indicating a position of the detected lost bit.

2. The decoding device according to claim 1, wherein
the second error correction decoder includes a selector for selecting a value of either a likelihood information value of the data series re-read from the memory circuit or the predetermined value according to the erasure flag, and wherein
the selector selects the likelihood information value when the re-read likelihood information value of the data series does not correspond to the position of the lost bit, and selects the predetermined value when the re-read likelihood information value of the data series corresponds to the position of the lost bit.

3. The decoding device according to claim 1, wherein the demodulator creates a log likelihood ratio concerning the encoded data as the likelihood information value.

4. The decoding device according to claim 3, wherein the inner code for second error correction is a low density parity check code.

5. The decoding device according to claim 4, wherein the second error correction decoder executes the repetitive decoding according to a Sum-Product decoding method.

6. The decoding device according to claim 1, wherein the first error correction decoder detects a lost bit in the hard decision value series in symbol parts of predetermined bits.

7. The decoding device according to claim 6, wherein the outer code for first error correction is a Reed-Solomon code, and the first error correction decoder executes Reed-Solomon decoding as the algebraic decoding.

8. A decoding device for performing error correction decoding of encoded data formed from a combination of an outer code for first error correction and an inner code for second error correction, the device comprising:
a demodulator for demodulating the encoded data and creating a data series of likelihood information values;
a lost position detection part for detecting a lost bit in the data series of likelihood information values and creating a first erasure flag indicating a position of the detected lost bit;
a memory circuit for temporarily storing the data series of likelihood information values;
a second error correction decoder for creating a hard decision value series by executing repetitive decoding for the second error correction based on the data series likelihood information values read from the memory circuit when the lost bit is not detected; and
a first error correction decoder for executing algebraic decoding for the first error correction to the hard decision value series, wherein
when the lost bit is detected, the second error correction decoder executes the repetitive decoding based on a likelihood information value not corresponding to the position of the lost bit among the data series of likelihood information values read from the memory circuit and a predetermined value that invalidates a likelihood information value corresponding to the position of the lost bit among the read data series of likelihood information values, and wherein
the lost position detection part includes:
a code extraction part for extracting a likelihood information value of a user data area and a data area corresponding to the outer code from the data series of likelihood information values created by the demodulator; and
an error correction decoder for creating the first erasure flag by executing algebraic decoding for the first error correction to a data series of a most significant bit of the likelihood information values extracted by the code extraction part.

9. The decoding device according to claim 8, wherein
the first error correction decoder detects a lost bit in the hard decision value series by executing algebraic decoding for the first error correction to the hard decision value series, and creates a second erasure flag indicating the position of the detected lost bit, and wherein
the second error correction decoder, according to the second erasure flag, re-reads the data series of likelihood information values from the memory circuit, and executes the repetitive decoding based on a likelihood information value not corresponding to the position of the lost bit among the re-read data series and a predetermined value that invalidates a likelihood information value corresponding to the position of the lost bit among the re-read data series.

10. The decoding device according to claim 9, further comprising a selection circuit for selecting either decoded data supplied from the first error correction decoder or decoded data supplied from the error correction decoder of the lost position detection part, and outputting the selected decoded data, wherein
the error correction decoder of the lost position detection part includes a decoding status determination part for determining whether error correction can be performed when an error is detected in the data series of the most significant bit of the likelihood information values, and wherein
the selection circuit selects the decoded data supplied from the first error correction decoder when the status determination part determines that error correction cannot be performed, and selects the decoded data supplied from the error correction decoder of the lost position detection part when the status determination part determines that error correction can be performed.

11. The decoding device according to claim 8, further comprising a selection circuit for selecting either decoded data supplied from the first error correction decoder or decoded data supplied from the error correction decoder of the lost position detection part, and outputting the selected decoded data, wherein
the error correction decoder of the lost position detection part includes a decoding status determination part for determining whether error correction can be performed when an error is detected in the data series of the most significant bit of the likelihood information values, and wherein
the selection circuit selects the decoded data supplied from the first error correction decoder when the status determination part determines that error correction cannot be performed, and selects the decoded data supplied from the error correction decoder of the lost position detection part when the status determination part determines that error correction can be performed.

* * * * *